(12) United States Patent
Itagaki et al.

(10) Patent No.: US 9,596,750 B2
(45) Date of Patent: Mar. 14, 2017

(54) ELECTRONIC CIRCUIT, METHOD OF MANUFACTURING ELECTRONIC CIRCUIT, AND MOUNTING MEMBER

(71) Applicant: SONY CORPORATION, Tokyo (JP)

(72) Inventors: Tomoari Itagaki, Kanagawa (JP); Kenichi Kawasaki, Tokyo (JP); Kentaro Yasunaka, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 382 days.

(21) Appl. No.: 13/660,111

(22) Filed: Oct. 25, 2012

(65) Prior Publication Data

US 2013/0114218 A1    May 9, 2013

(30) Foreign Application Priority Data

Nov. 4, 2011    (JP) ................. 2011-241943

(51) Int. Cl.
*H05K 1/02*    (2006.01)
*H05K 3/30*    (2006.01)
(Continued)

(52) U.S. Cl.
CPC ............. *H05K 1/025* (2013.01); *H01L 23/48* (2013.01); *H01L 23/66* (2013.01); *H01P 5/028* (2013.01); *H01L 23/538* (2013.01); *H01L 24/16* (2013.01); *H01L 24/48* (2013.01); *H01L 2223/6611* (2013.01); *H01L 2223/6627* (2013.01); *H01L 2223/6638* (2013.01); *H01L 2223/6677* (2013.01); *H01L 2224/16225* (2013.01); *H01L 2224/48091* (2013.01); *H01L 2224/48227* (2013.01); *H01L 2924/00014* (2013.01);

(Continued)

(58) Field of Classification Search
CPC ......... H01P 5/028; H05K 1/025; H01L 23/48; H01L 23/66
USPC .......................................... 333/33
See application file for complete search history.

(56) References Cited

U.S. PATENT DOCUMENTS 5,534,830 A * 7/1996 Ralph ........................... 333/128
7,945,231 B2 * 5/2011 Hoegerl ............... H01L 23/3128
                                                              257/700

(Continued)

FOREIGN PATENT DOCUMENTS

JP         2004-104651         4/2004

OTHER PUBLICATIONS

Kawasaki et al., A millimeter-wave intra-connect solution, Feb. 7-11, 2010, 2010 IEEE International Solid-State Circuits Conference Digest of Technical Papers (ISSCC), Session 23.1.*

(Continued)

*Primary Examiner* — Stephen E Jones
*Assistant Examiner* — Scott S Outten
(74) *Attorney, Agent, or Firm* — Dentons US LLP

(57) ABSTRACT

An electronic circuit includes: a semiconductor chip provided with a single-ended I/F including a pad on which single-ended signals are exchanged; and a mounting unit on which a differential transmission path transmitting a differential signal is formed, and on which the semiconductor chip is mounted so that the pad of the single-ended I/F is directly electrically connected to a conductor configuring the differential transmission path.

23 Claims, 23 Drawing Sheets

(51) Int. Cl.
    *H01P 5/02*           (2006.01)
    *H01L 23/48*         (2006.01)
    *H01L 23/66*         (2006.01)
    *H01L 23/00*         (2006.01)
    *H01L 23/538*       (2006.01)

(52) U.S. Cl.
    CPC .............. *H01L 2924/12041* (2013.01); *H01L 2924/19033* (2013.01); *H01L 2924/19039* (2013.01); *H01L 2924/3011* (2013.01); *H01L 2924/30107* (2013.01); *H05K 1/024* (2013.01); *H05K 1/0243* (2013.01); *Y10T 29/4913* (2015.01)

(56) References Cited

U.S. PATENT DOCUMENTS

| | | | | |
|---|---|---|---|---|
| 8,283,991 | B1* | 10/2012 | Essenwanger | 333/26 |
| 2010/0182096 | A1* | 7/2010 | Kim et al. | 333/26 |
| 2010/0283700 | A1* | 11/2010 | Rajanish et al. | 343/793 |
| 2011/0158344 | A1* | 6/2011 | Kawamura et al. | 375/295 |

OTHER PUBLICATIONS

Kenichi Kawasaki et al.; A Millimeter-Wave Intra-Connect Solution; IEEE Journal of Solid-State Circuits; vol. 45, No. 12; Dec. 2010.

Eric Juntunen et al.; A 60-GHz 38-;J/bit 3.5-Gb/s 90-nm CMOS OOK Digital Radio; IEEE Transactions on Microwave Theory and Techniques; vol. 58, No. 2; Feb. 2010.

\* cited by examiner

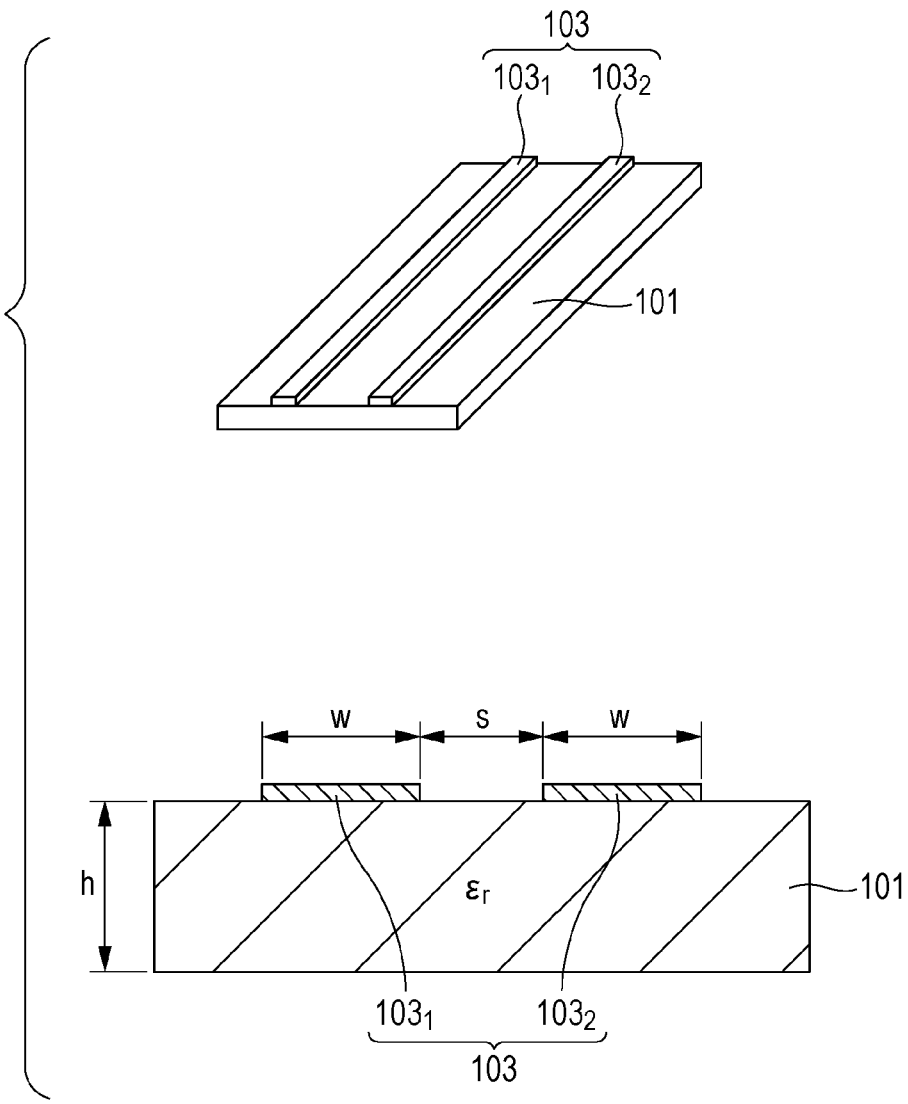

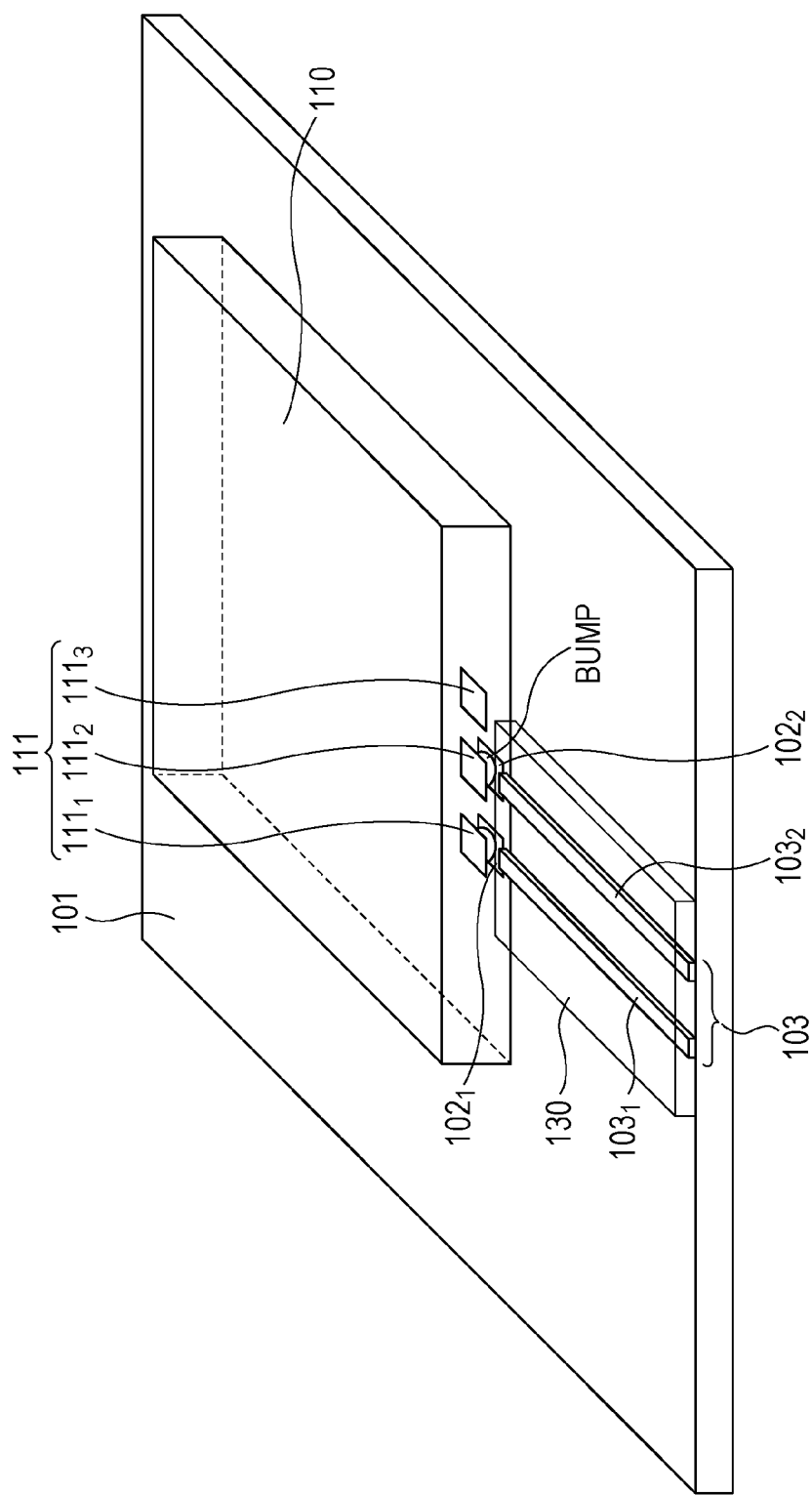

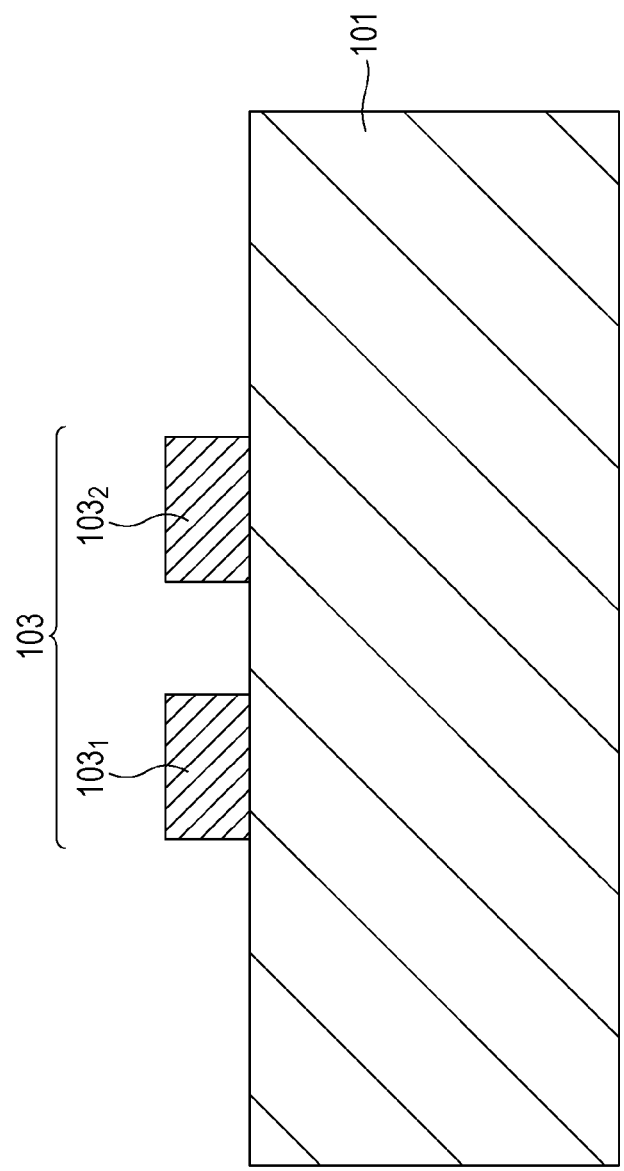

ELECTRONIC CIRCUIT, METHOD OF MANUFACTURING ELECTRONIC CIRCUIT, AND MOUNTING MEMBER

BACKGROUND

The present technology relates to an electronic circuit, a method of manufacturing the electronic circuit, and a mounting member, and particularly relates to, for example, an electronic circuit able to perform good quality data transmission while suppressing an increase in the size of the circuit, a method of manufacturing the electronic circuit, and a mounting member.

For example, in various electronic apparatuses such as television sets, video cameras, and recorders, a substrate on which an IC (Integrated Circuit) (including an LSI (Large-Scale Integration)) that is an electronic circuit performing various signal processes is placed is contained in the housing thereof.

Furthermore, in order to perform exchange of data (including actual data such as images and sounds, and control data) between ICs placed on the same substrate or ICs placed on different substrates, there is wired wiring between ICs and between substrates.

Incidentally, in recent years, with ICs, signal processing is performed with large-capacity data such as a 3D (dimension) image or a high-resolution image, and the large-capacity data may be exchanged between ICs at high speed.

Furthermore, in order to exchange high-capacity data, the number of wires in the wiring between the ICs and between the substrates increases, and it may be difficult for the wiring to cope with high frequencies.

It has therefore been proposed that the exchange of data between ICs be performed wirelessly.

That is, for example, a CMOS (Complementary Metal Oxide Semiconductor) circuit (IC) exchanging data at high-speed by modulating data into a millimeter waveband signal (millimeter wave) and transmitting the data is described in Kenichi, Kawasaki et. al. "A Millimeter-Wave Intra-Connect Solution", IEEE J. Solid-State Circuits, vol. 45, no. 12, pp. 2655-2666, December 2010 and Eric Juntunen et. al. "A 60-GHz 38-pJ/bit 3.5-Gb/s 90-nm CMOS OOK Digital Radio", IEEE Trans. Microwave Theory Tech., vol. 58, no. 2, February 2010.

Incidentally, with the CMOS (Complementary Metal Oxide Semiconductor) circuit modulating data into an RF (Radio Frequency) signal and transmitting the data described in Kenichi, Kawasaki et. al. "A Millimeter-Wave Intra-Connect Solution", IEEE J. Solid-State Circuits, vol. 45, no. 12, pp. 2655-2666, December 2010, Eric Juntunen et. al. "A 60-GHz 38-pJ/bit 3.5-Gb/s 90-nm CMOS OOK Digital Radio", IEEE Trans. Microwave Theory Tech., vol. 58, no. 2, February 2010, and the like, the interface of an RF unit processing the RF signal is a single-ended I/F (Interface) exchanging single-ended signals.

That is, a single-ended I/F is adopted as the RF unit for reasons such as, for example, the RF signal that the RF unit outputs is easily measured (the probe of a measurement device measuring the millimeter waves is compatible with single-ended signals), the circuit configuration of the CMOS circuit is simplified, and power consumption is lowered.

On the other hand, data transmission by a single-ended signal may be poor in quality compared to data transmission by a differential signal.

That is, while in a case where a single-ended signal is transmitted, for example, in a case where a micro strip track is formed on a CMOS circuit on which an RF unit is mounted, an interposer, a print substrate (PCB (Printed Circuit Board)), or the like, an unlimited grounded conductor is ideally used, it is difficult to provide an unlimited grounded conductor, and as a result, the quality of data transmission deteriorates.

Further, with data transmission using a single-ended signal, since there is more unnecessary radiation and resistance to noise from the outside (outside of the transmission path through which a single-ended signal is transmitted) is weak compared to data transmission using a differential signal, the quality of data transmission deteriorates.

Accordingly, there is a method of performing good quality data transmission by converting a single-ended signal into a differential signal and performing data transmission using the differential signal.

The conversion between a single-ended signal and a differential signal is called balanced to unbalanced conversion, and a circuit performing balanced to unbalanced conversion is referred to as a balun.

For example, a balun that converts a single-ended signal (unbalanced input) on a coplanar track into a differential signal (balanced output) and outputs the converted signal from a coplanar strip track is described in Japanese Unexamined Patent Application Publication No. 2004-104651.

SUMMARY

Good quality data transmission is able to be performed by converting a single-ended signal of the RF unit into a differential signal using a balun.

However, when converting a single-ended signal of the RF unit into a differential signal using a balun, a balun is provided on a CMOS circuit on the like, increasing the size of the circuit.

It is desirable to perform good quality data transmission while suppressing an increase in the size of the circuit.

An electronic circuit according to a first embodiment of the present technology includes: a semiconductor chip provided with a single-ended I/F including a pad on which single-ended signals are exchanged; and a mounting unit on which a differential transmission path transmitting a differential signal is formed, and on which the semiconductor chip is mounted so that the pad of the single-ended I/F is directly electrically connected to a conductor configuring the differential transmission path.

A method of manufacturing the electronic circuit according to a second embodiment of the present technology includes: directly electrically connecting, when mounting a semiconductor chip provided with a single-ended I/F including a pad on which single-ended signals are exchanged onto a mounting unit on which a differential transmission path transmitting a differential signal is formed and on which the semiconductor chip is mounted, the pad of the single-ended I/F with a conductor configuring the differential transmission path.

According to the second embodiment of the present technology, a single-ended I/F including a pad on which single-ended signals are exchanged may be provided on the semiconductor chip, and a differential transmission path transmitting a differential signal may be formed on the mounting unit. Furthermore, the semiconductor chip is mounting on the mounting unit so that the pad of the single-ended I/F is directly electrically connected to a conductor configuring the differential transmission path.

A mounting member according to a third embodiment of the present technology on which a differential transmission path transmitting a differential signal is formed, a dielectric is placed on the differential transmission path, and a semiconductor chip on which a single-ended I/F including a pad on which single-ended signals are exchanged is provided is mounted.

According to the third embodiment of the present technology, a differential transmission path transmitting a differential signal may be formed on a mounting member on which is mounted a semiconductor chip, on which a single-ended I/F including a pad on which single-ended signals are exchanged is provided. Furthermore, a dielectric is placed on the differential transmission path.

According to the embodiments of the present technology, it is possible to perform good quality data transmission while suppressing an increase in the size of the circuit.

BRIEF DESCRIPTION OF THE DRAWINGS

FIG. 9 is a perspective view and a cross-sectional view illustrating a coplanar strip track as the differential transmission path;

FIG. 10 is a perspective view illustrating a configuration example of a third embodiment of the electronic circuit to which the embodiments of the present technology are applied;

FIG. 12 is a view describing a method of performing an adjustment to decrease the impedance of the coplanar strip track;

DETAILED DESCRIPTION OF EMBODIMENTS

While embodiments of the present technology will be described below, before doing so, as a preparation for an earlier process, a millimeter wave transmission system exchanging single-ended signal millimeter waves will be described.

[Millimeter Wave Transmission System Exchanging Single-Ended Signal Millimeter Waves]

Figure 1:
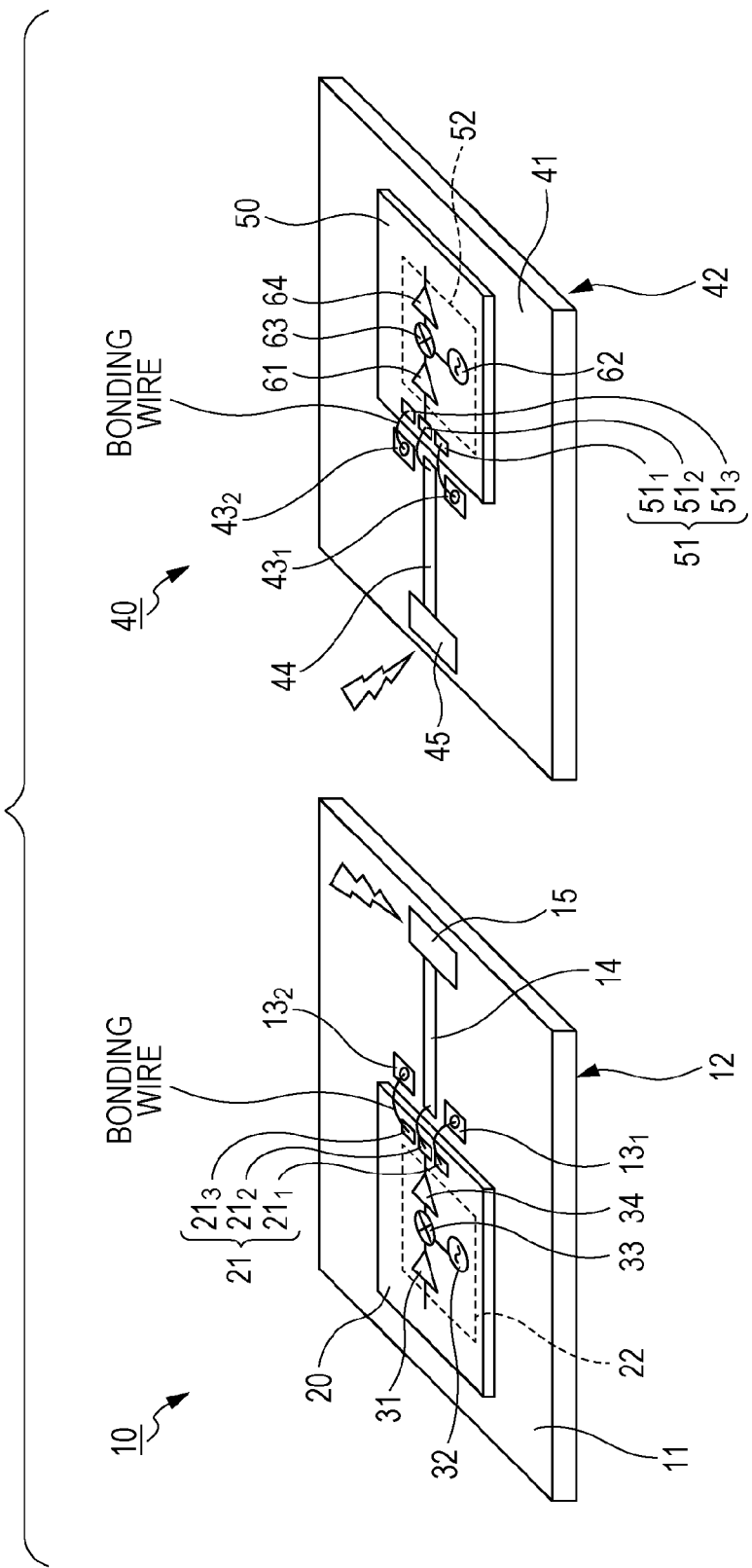
FIG. 1 is a view illustrating a configuration example of a millimeter wave transmission system exchanging single-ended signal millimeter waves.

FIG. 1 illustrates a configuration example of a millimeter wave transmission system exchanging single-ended signal millimeter waves.

In FIG. 1, the millimeter wave transmission system includes, for example, electronic circuits 10 and 40 which are ICs.

The electronic circuit 10 has a function of transmitting data using millimeter waves, and the electronic circuit 40 has a function of receiving the data using millimeter waves.

The electronic circuit 10 includes a mounting unit 11 and a millimeter wave transmission chip 20.

The mounting unit 11 is a member (mounting member) of an interposer, a printed substrate, or the like, for example, on which a semiconductor chip is mounted, and has a flat plate-like shape.

A millimeter wave transmission chip 20 which is a semiconductor chip is mounted on the front face which is one face of the flat plate-like mounting unit 11, a thin film-like metallic grounded metal 12 which is the ground is provided on the reverse face which is the other face of the flat plate-like mounting unit 11 across the entire area thereof or an area close to the entire area.

Furthermore, vias $13_1$ and $13_2$, a micro strip track 14, and an antenna 15 are formed on the front face of the mounting unit 11.

The vias $13_1$ and $13_2$ are connected to the grounded metal 12 on the reverse face of the mounting unit 11.

The micro strip track 14 is an unbalanced transmission path, and is formed on the mounting unit 11 in a band form. One end of the band-like micro strip track 14 is connected to the antenna 15.

The antenna 15 is configured, for example, by an approximately 1 mm bounding wire.

The millimeter wave transmission chip 20 is configured by a CMOS or the like, for example, and includes a single-ended I/F 21, a transmission unit 22, and the like.

The single-ended I/F 21 includes three pads $21_1$, $21_2$, and $21_3$ which are terminals for exchanging single-ended signals (unbalanced signals).

Two of the pads $21_1$ and $21_3$ of the three pads $21_1$ to $21_3$ are grounded (GND) terminals (grounded pads) of the transmission unit 22, and are respectively connected to the vias $13_1$ and $13_2$ by a bonding wire. Therefore, the pad $21_1$ and the pad $21_3$ are respectively connected to the grounded metal 12 on the reverse face of the mounting unit 11 via the via $13_1$ and the via $13_2$.

The remaining pad $21_2$ out of the three pads $21_1$ to $21_3$ is a signal terminal (signal pad) on which signals are exchanged, and the output of (an amplifier 34 of) the transmission unit 22 is supplied to the pad $21_2$. The pad $21_2$ is connected to the other end of the micro strip track 14 (the end portion not connected to the antenna 15) by a bonding wire.

The transmission unit 22 performs transmission of millimeter waveband signals (millimeter waves).

Here, a millimeter wave is a signal with a frequency of approximately 30 to 300 GHz, that is, a wavelength of approximately 1 to 10 mm. Since a millimeter waveband signal has a high frequency, data transmission with a high-speed data rate is possible, and in addition to wired communication, wireless communication (wireless transmission) using a small antenna is also able to be performed.

The transmission unit 22 includes an amplifier 31, an oscillator 32, a mixer 33, and an amplifier 34.

Transmission data of a transmission target is supplied to the amplifier 31 from a signal processing circuit (not shown). The amplifier 31 supplier adjusts the level of the supplied transmission data, and supplies the transmission data to the mixer 33.

Here, as the transmission data, for example, data with a data rate of a maximum of 11 Gbps is able to be adopted.

The oscillator 32 generates a millimeter waveband carrier of 56 GHz or the like, for example, and supplies the carrier to the mixer 33.

The mixer 33 modulates the carrier from the oscillator 32 according to the transmission data by mixing (multiplying) the transmission data from the amplifier 31 with the carrier from the oscillator 32, and supplies the modulated signal obtained as a result to the amplifier 34.

Here, while the modulation method of modulating a carrier according to the transmission data is not particularly limited, here, in order to simplify description, for example, amplitude modulation (ASK (Amplitude Shift Keying)) is adopted.

The amplifier 33 amplifies the modulated signal from the mixer 34 and outputs the amplified modulated signal as a single-ended signal. The modulated signal which is the single-ended signal that the amplifier 34 outputs is supplied to the pad $21_2$.

As described above, the pad $21_2$ is connected to the micro strip track 14 by a bonding wire, and therefore, the modulated signal that the amplifier 34 passes through the micro strip track 14 while still a single-ended signal, and is transmitted as a radio wave from the antenna 15.

The electronic circuit 40 includes a mounting unit 41 and a millimeter wave transmission chip 50.

Similarly to the mounting unit 11, the mounting unit 41 is a member (mounting member) of a flat plate-like interposer, printed substrate, or the like, and the millimeter wave transmission chip 50 which is a semiconductor chip is mounted on the front face which is one face thereof.

Further, similarly to the mounting unit 11, a thin film-like metallic grounded metal 42 which is the ground is provided on the reverse face which is the other face of the flat plate-like mounting unit 41 across the entire area thereof or an area close to the entire area.

Furthermore, vias $43_1$ and $43_2$, a micro strip track 44, and an antenna 45 are formed on the surface of the mounting unit 41.

The vias $43_1$ and $43_2$ are connected to the grounded metal 42 on the reverse side of the mounting unit 41.

The micro strip track 44 is an unbalanced transmission path, and is formed on the mounting unit 41 in a band form. One end of the band-like micro strip track 44 is connected to the antenna 45.

Similarly to the antenna 15, the antenna 45 is configured, for example, by an approximately 1 mm bounding wire.

Similarly to the millimeter wave transmission chip 20, the millimeter wave transmission chip 50 is configured by a CMOS or the like, for example, and includes a single-ended I/F 51, a transmission unit 52, and the like.

Similarly to the single-ended I/F 21, the single-ended I/F 51 includes three pads $51_1$, $51_2$, and $51_3$ which are terminals for exchanging single-ended signals.

Two of the pads $51_1$ and $51_3$ of the three pads $51_1$ to $51_3$ are grounded (GND) terminals of the reception unit 52, and are respectively connected to the vias $43_1$ and $43_2$ by a bonding wire. Therefore, the pad $51_1$ and the pad $51_3$ are respectively connected to the grounded metal 42 on the reverse face of the mounting unit 41 via the via $43_1$ and the via $43_2$.

The remaining pad $51_2$ out of the three pads $51_1$ to $51_3$ is a signal terminal on which signals are exchanged, and the output of (an amplifier 61 of) the reception unit 52 is supplied to the pad $51_2$. The pad $51_2$ is connected to the other end of the micro strip track 44 (the end portion not connected to the antenna 45) by a bonding wire.

The reception unit 52 performs transmission of millimeter waveband signals (millimeter waves).

The reception unit 52 includes an amplifier 61, an oscillator 62, a mixer 63, and an amplifier 64.

A modulation signal passing from the micro strip track 44 to the pad $52_2$ is supplied as a single-ended signal to the amplifier 61.

The amplifier 61 amplifies the modulated signal from the pad $52_2$ and supplies the amplified modulated signal to the oscillator 62 and the mixer 63.

The oscillator 62 generates a carrier which is synchronized with the modulated signal from the amplifier 61 through oscillation, and supplies the carrier to the mixer 63.

The mixer 63 converts the modulated signal from the amplifier 61 into a baseband signal by mixing (multiplying) the modulated signal from the amplifier 61 with the carrier from the oscillator 62, and supplies the baseband signal to the amplifier 64.

The amplifier 64 amplifies and outputs the baseband signal from the mixer 63.

The base band signal that the amplifier 64 outputs is filtered by an LPF (Low Pass Filter) (not shown), and in so doing, (frequency components corresponding to) the transmission data is extracted (obtained). The transmission data is supplied to and processed at a signal processing circuit (not shown).

In the millimeter wave transmission system configured as described above, in the electronic circuit 10, the transmission unit 22 outputs a millimeter wave modulated signal as a single-ended signal from the pad $21_2$ of the single-ended I/F 21.

The pad $21_2$ is connected to the micro strip track 14 by a bonding wire, and the modulated signal output from the pad $21_2$ passes through the micro strip track 14 while still a single-ended signal, and is transmitted wirelessly from the antenna 15.

The modulated signal transmitted from the antenna 15 is received by the antenna 45, passes through the micro strip track 44 as a single-ended signal, and reaches the pad $51_2$ of the single-ended I/F 51 via a bonding wire.

The modulated signal reaching the pad $51_2$ of the single-ended I/F 51 is received by the reception unit 52, and is demodulated into a baseband signal.

Here, while the transmission unit 22 transmitting millimeter waves is provided on the millimeter wave transmission chip 20 and a reception unit transmitting millimeter waves is not provided, it is possible to provide both the transmission unit 22 and a reception unit configured similarly to the reception unit 52 on the millimeter wave transmission chip 20. By providing both the transmission unit 22 and a reception unit configured similarly to the reception unit 52 on the millimeter wave transmission chip 20, the millimeter wave transmission chip 20 is able to receive as well as transmit millimeter waves.

Similarly, it is possible to provide the reception unit 52 and a transmission unit configured similarly to the transmission unit 22 on the millimeter wave transmission chip 50.

Figure 2:
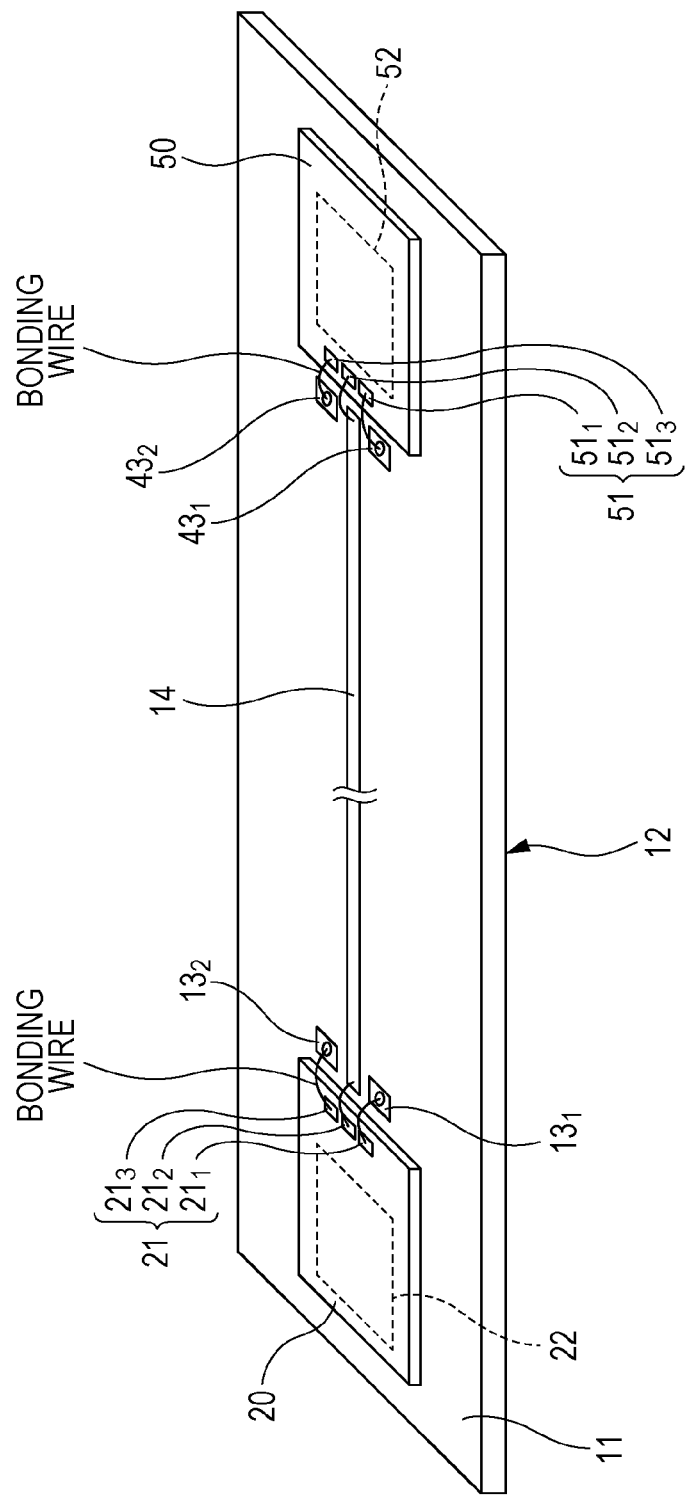
FIG. 2 is a view illustrating another configuration example of a millimeter wave transmission system exchanging single-ended signal millimeter waves.

FIG. 2 is a view illustrating another configuration example of the millimeter wave transmission system exchanging single-ended millimeter waves.

Here, in the drawing, the same symbols are given to portions corresponding to the case of FIG. 1, and description thereof will be omitted below as appropriate.

In FIG. 2, in addition to the millimeter wave transmission chip 20, the millimeter wave transmission chip 50 is also mounted on the mounting unit 11.

Furthermore, one end of the micro strip track 14 is connected not to the antenna 15 but to the pad $51_2$ of the single-ended I/F 51 by a bonding wire.

Here, in FIG. 2, the vias $43_1$ and $43_2$ are formed on the front face of the mounting unit 11, and the vias $43_1$ and $43_2$ are connected to the grounded metal 12 on the reverse face of the mounting unit 11. Furthermore, the pads $51_1$ and $51_3$ of the single-ended I/F 51 are respectively connected to the vias $43_1$ and $43_2$ by a bonding wire.

In the millimeter wave transmission system configured as described above, the transmission unit 22 outputs a millimeter wave modulated signal as a single-ended signal from the pad $21_2$ of the single-ended I/F 21.

The pad $21_2$ is connected to the micro strip track 14 by a bonding wire, and the modulated signal output from the pad $21_2$ passes through the micro strip track 14 while still a single-ended signal, and reaches the pad $51_2$ of the single-ended I/F 51 via a bonding wire.

The modulated signal reaching the pad $51_2$ of the single-ended I/F 51 is received by the reception unit 52 and is demodulated into a baseband signal.

In the transmission unit 22 transmitting millimeter waves and the reception unit 52 receiving millimeter waves, a single-ended I/F (the single-ended I/Fs 21 and 51) is adopted as an I/F exchanging millimeter waves for reasons such as RF signals such as modulated signals being easily measured (the probe of a measurement device measuring the millimeter waves is compatible with single-ended signals), the circuit configuration of the CMOS circuit is simplified, and power consumption is lowered.

However, data transmission by a single-ended signal may be poor in quality compared to data transmission by a differential signal.

That is, while in a case where the micro strip track 14 transmitting a single-ended signal is formed on the mounting unit 11 such as an interposer or a printed substrate as illustrated in FIGS. 1 and 2, an unlimited grounded conductor is ideally used, it is difficult to provide an unlimited grounded conductor, and as a result, the quality of data transmission may deteriorate. The same is also true in a case where the micro strip track 44 is formed on the mounting unit 41 as illustrated in FIG. 1.

Further, with data transmission using a single-ended signal, since there is more unnecessary radiation and resistance to noise from the outside (outside of the micro strip tracks 14 and 44 through which a single-ended signal is transmitted) is weak compared to data transmission using a differential signal, the quality of data transmission may deteriorate.

Figure 3:
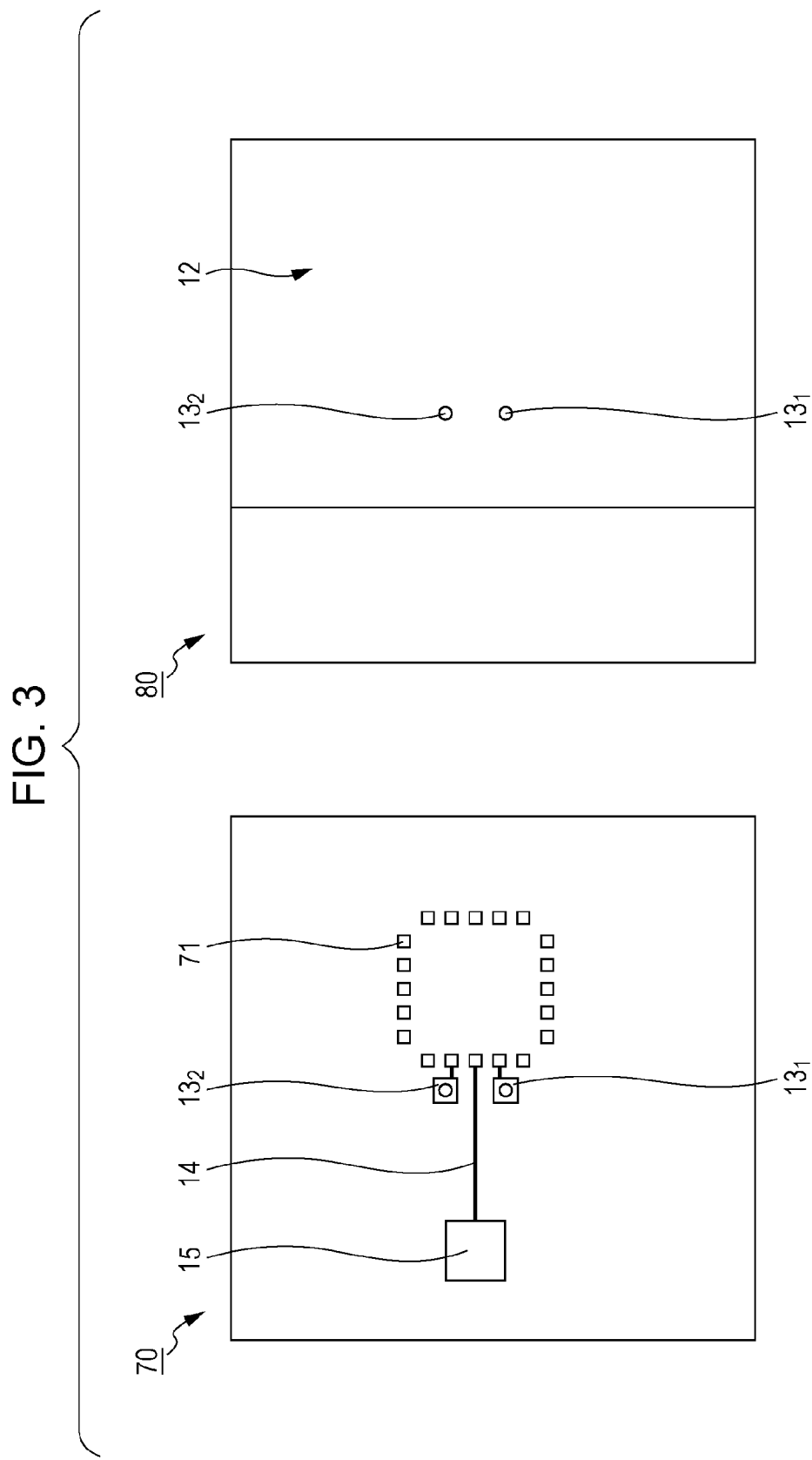
FIG. 3 is a plan view illustrating a configuration example of an interposer in a case where a mounting unit is an interposer.

Here, FIG. 3 is a plan view illustrating a configuration example of an interposer in a case where the mounting unit 11 of FIG. 1 is an interposer.

In FIG. 3, the interposer includes the two layers of a first layer 70 and a second layer (GND layer) 80. The first layer 70 and the second layer 80 have a flat plate shape, and for example, the second layer 80 is positioned to the lower side of the first layer 70.

The vias $13_1$ and $13_2$, the micro strip track 14, and the antenna 15 described in FIG. 1 are formed on the first layer 70.

Furthermore, a pad (not shown) of the millimeter wave transmission chip 20 and a land 71 connected by a bond wire are formed on the first layer 70.

The grounded metal 12 is formed on the second layer 80, and the vias $13_1$ and $13_2$ formed on the first layer are connected to the grounded metal 12.

As illustrated in FIG. 3, on an interposer, in a case where the micro strip track 14 transmitting a single-ended signal is formed on the first layer 70, it is important to form the grounded metal 12 over a wide area. In FIG. 3, the grounded metal 12 is formed over approximately two thirds of the area on the right side of the second layer 80, and the grounded metal 12 formed over such a wide area pressurizes the wiring on the interposer.

As a method of performing good quality data transmission, there is a method of performing data transmission using a differential signal by converting a single-ended signal into a differential signal.

However, a balun is used in a conversion between a single-ended signal and a differential signal, even as millimeter waves with short wavelengths are used, a large element compared to the transmission unit 22 and the reception unit 52 is used to configure a balun. Therefore, if a balun is mounted, the size of the circuit increases.

Therefore, in the embodiments of the present technology, it is possible to perform good quality data transmission while suppressing an increase in the size of the circuit.

First Embodiment

Figure 4:
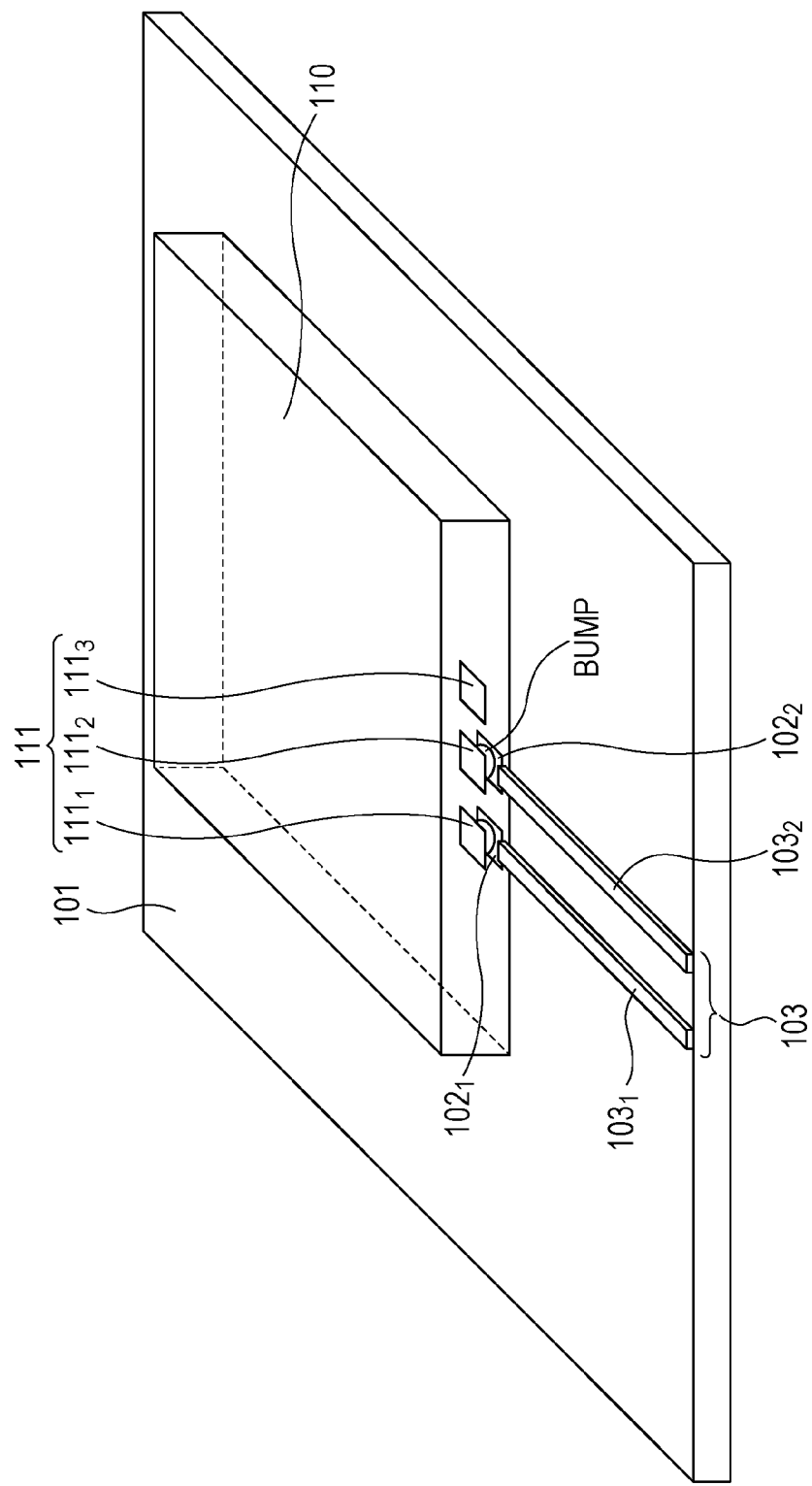
FIG. 4 is a perspective view illustrating a configuration example of a first embodiment of an electronic circuit to which the embodiments of the present technology are applied.
Figure 5:
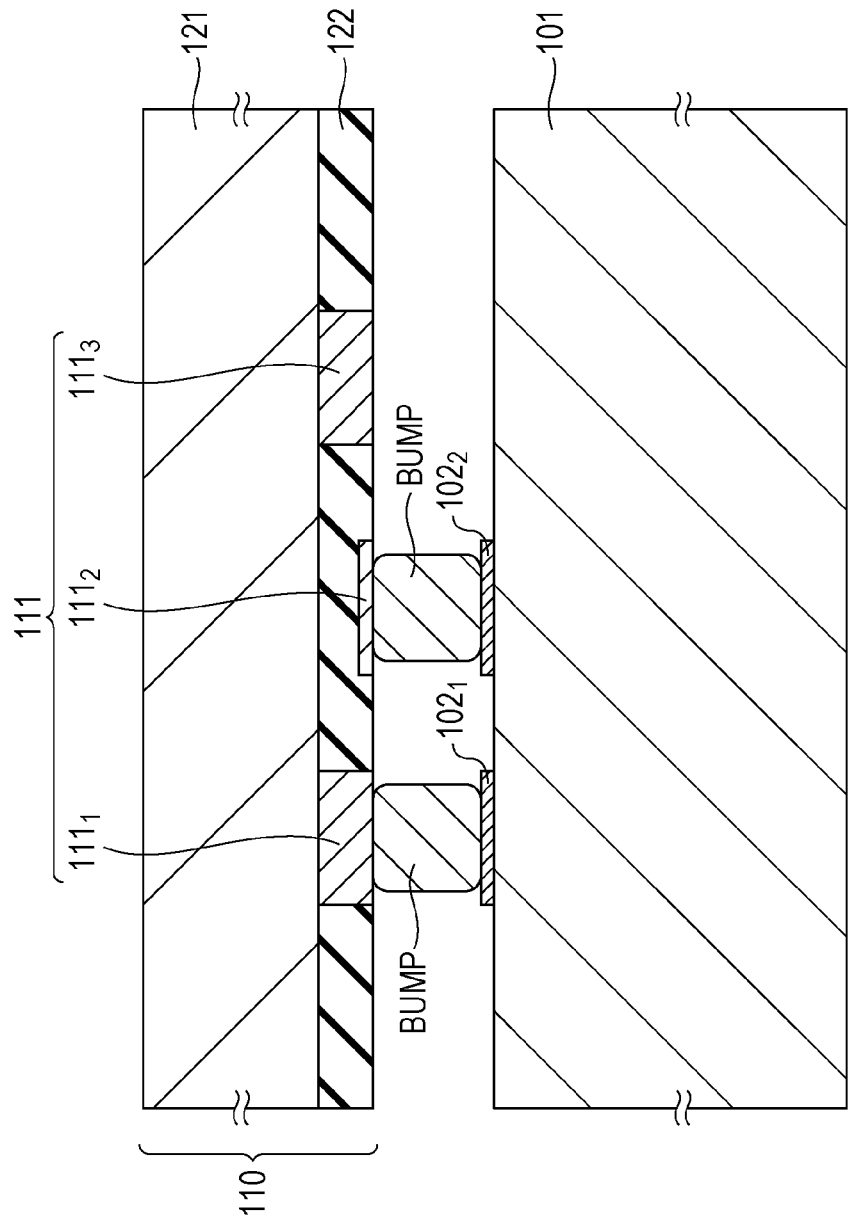
FIG. 5 is a cross-sectional view illustrating a configuration example of the first embodiment of the electronic circuit to which the embodiments of the present technology are applied.

FIG. 4 is a perspective view illustrating a configuration example of a first embodiment of an electronic circuit to which the embodiments of the present technology are applied, and FIG. 5 is a cross-sectional view of the portion of a single-ended I/F 111 of the electronic circuit of FIG. 4.

In FIGS. 4 and 5, the electronic circuit includes a mounting unit 101 and a millimeter wave transmission chip 110.

Similarly to the mounting unit 11 of FIG. 1, for example, the mounting unit 101 is a member (mounting member) of a flat plate-like interposer, a printed substrate, or the like, for example, and a semiconductor chip is mounted thereon.

The millimeter wave transmission chip 110 which is a semiconductor chip is mounted on the front face which is one face of the flat plate-like mounting unit 101.

Here, while a metallic thin film-like grounded metal which is a ground is provided on the reverse face which is the other face of the flat plate-like mounting unit 101, the illustration thereof in the drawings is omitted.

Lands $102_1$ and $102_2$ and a coplanar strip track 103 are formed on the front face of the mounting unit 101.

The lands $102_1$ and $102_2$ are connected to the coplanar strip track 103.

The coplanar strip track 103 is a balanced transmission path (differential transmission path) on which differential signals are exchanged, and is configured on the mounting unit 101 by including two band-like conductors $103_1$ and $103_2$ formed to be parallel.

One end of the conductor $103_1$ is connected to the land $102_1$, and one end of the conductor $103_2$ is connected to the land $102_2$.

The millimeter wave transmission chip 110 is configured by a CMOS or the like, for example, and includes the single-ended I/F 111 and the like.

Here, while the millimeter wave transmission chip 110 includes the RF unit configured similarly to the transmission unit 22 or the reception unit 52 of FIG. 1, the illustration thereof in the drawings is omitted.

The single-ended I/F 111 includes three pads $111_1$, $111_2$, and $111_3$ which are terminals for the RF unit to exchange single-ended signals (unbalanced signals).

Here, in FIG. 4, while the lands $102_1$ and $102_2$, the pads $111_1$ to $111_3$, and bumps are in reality hidden from view by the millimeter wave transmission chip 110, in FIG. 4, the lands $102_1$ and $102_2$, the pads $111_1$ to $111_3$, and the bumps are shown with the assumption that the millimeter wave transmission chip 110 is colorless and transparent.

Two pads $111_1$ and $111_3$ of the three pads $111_1$ to $111_3$ are ground (GND) terminals of the RF unit, and the remaining pad $111_2$ is a signal terminal at which signals (signal components) are exchanged. Therefore, in the RF unit, a modulated signal as a single-ended signal is output from the pad $111_2$, and a signal supplied to the pad $111_2$ is treated as a single-ended signal.

In FIGS. 4 and 5, the millimeter wave transmission chip 110 is mounted (for example, flip chip-mounted) on the mounting unit 101 so that the pads $111_1$ and $111_2$ of the single-ended I/F 111 are respectively electrically directly connected (without passing through a balun performing balanced or unbalanced conversion) with the conductors $103_1$ and $103_2$ configuring the coplanar strip track 103.

Here, as illustrated in FIG. 5, the millimeter wave transmission chip 110 is configured by forming a silicon oxide film 122 on a silicon 121. The pads $111_1$ to $111_3$ are formed on the silicon 121 or on the silicon oxide film 122.

In FIGS. 4 and 5, the conductor $103_1$ and the pad $111_1$ are directly electrically connected via the land $102_1$ and a bump, and the conductor $103_2$ and the pad $111_2$ are directly electrically connected via the land $102_2$ and a bump.

Here, in FIGS. 4 and 5, while the pad $111_3$ which is a grounded terminal of the single-ended I/F 111 is not connected to anything, other grounded terminals (grounded terminals (not shown) connected to the pads $111_1$ and $111_3$) of (the RF unit of) the millimeter wave transmission chip 110 are connected to a grounded metal (not shown) provided on the mounting unit 101.

Here, in FIGS. 4 and 5, the pad $111_3$ which is the grounded terminal of the single-ended I/F 111 is able to be connected to the grounded metal (not shown) provided on the mounting unit 101.

Further, in FIGS. 4 and 5, the pads $111_1$ and $111_3$ out of the three pads $111_1$ to $111_3$ of the single-ended I/F 111 are all grounded terminals, and instead of the pad $111_1$, the pad $111_3$ is able to be directly electrically connected to the conductor $103_1$.

The electronic circuit of FIGS. 4 and 5 is able to be manufactured by directly electrically connecting the pads $111_1$ and $111_2$ of the single-ended I/F 111 to the conductors $103_1$ and $103_2$ configuring the coplanar strip track 103, that is, directly electrically connecting the conductor $103_1$ with the pad $111_1$ via the land $102_1$ and a bump and directly electrically connecting the conductor $103_2$ with the pad $111_2$ via the land $102_2$ and a bump when mounting the millimeter wave transmission chip 110 on which the single-ended I/F 111 is provided on the mounting unit 101 on which the coplanar strip track 103 is formed.

In the electronic circuit configured as described above, with regard to signals output from the single-ended I/F 111, on the coplanar strip track 103, a signal (ideally ground level) appearing at the pad $111_1$ connected to the conductor $103_1$ and a signal (single-ended signal) appearing at the pad $111_2$ connected to the conductor $103_2$ are transmitted as the cold side and the hot side (negative and positive) signals of a differential signal.

Further, with regard to a differential signal transmitted from the coplanar strip track 103 to the millimeter wave transmission chip 110, a signal appearing at the pad $111_2$ connected to the conductor $103_2$ on the millimeter wave transmission chip 110 is treated as a single-ended signal.

As described above, since the millimeter wave transmission chip 110 is mounted on the mounting unit 101 so that the pads $111_1$ and $111_2$ of the single-ended I/F 111 are respectively directly electrically connected to the conductors $103_1$ and $103_2$ configuring the coplanar strip track 103, it is possible to perform good quality data transmission wile suppressing an increase in the size of the circuit.

That is, since a balun is not provided on the electronic circuit of FIGS. 4 and 5, compared to a case where a balun is provided, it is possible to suppress an increase in the size of the circuit and to reduce power consumption.

Further, since a single-ended signal that the millimeter transmission chip 110 handles is transmitted as a differential signal on the coplanar strip track 103, it is possible to perform good quality data transmission.

Furthermore, since a differential signal is transmitted on the coplanar strip track 103, it is possible to negate common mode noise (common mode signals) generated on the electronic circuit.

Here, since a single-ended signal is output from the pad $111_2$ which is a signal output and the single-ended I/F 111 including the two pads $111_1$ and $111_3$ which are grounded terminals from the millimeter wave transmission chip 110, it is also possible to utilize advantages of adopting a single-ended I/F such as the RF signal (modulated signal) which is the single-ended signal being easily measured (the probe of a measurement device measuring the millimeter waves is compatible with single-ended signals), the circuit configuration of the CMOS circuit is simplified, and power consumption is lowered.

Second Embodiment

Figure 6:
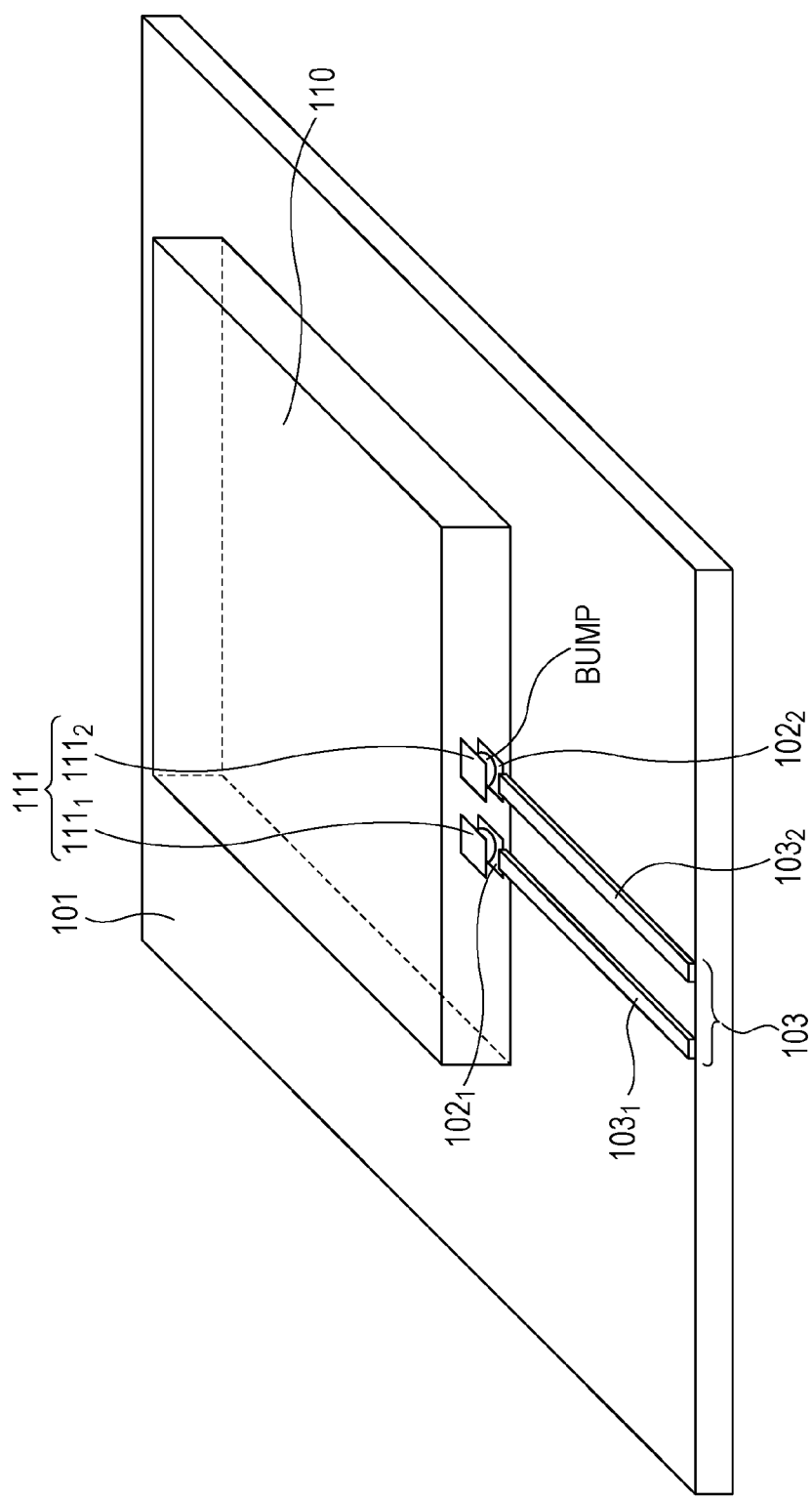
FIG. 6 is a perspective view illustrating a configuration example of a second embodiment of the electronic circuit to which the embodiments of the present technology are applied.
Figure 7:
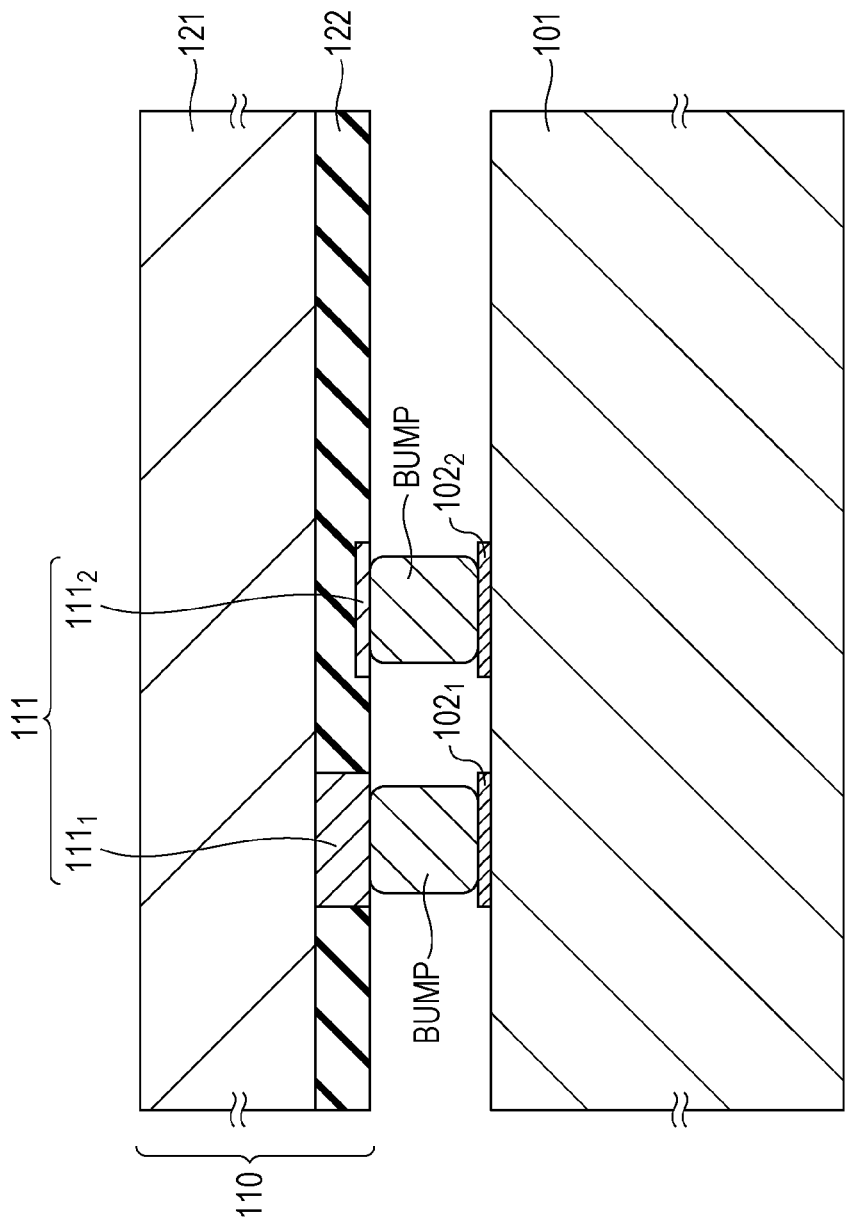
FIG. 7 is a cross-sectional view illustrating a configuration example of the second embodiment of the electronic circuit to which the embodiments of the present technology are applied.

FIG. 6 is a perspective drawing illustrating a configuration example of a second embodiment of the electronic circuit to which the embodiments of the present technology are applied, and FIG. 7 is a cross-sectional view of the portion of the single-ended I/F 111 of the electronic circuit of FIG. 6.

Here, in the drawings, the same symbols are given to portions corresponding to the case of the first embodiment of FIGS. 4 and 5, and description thereof will be omitted below as appropriate.

The second embodiment of FIGS. 6 and 7 differs from the case of the first embodiment of FIGS. 4 and 5 in that the single-ended I/F 111 includes two pads $111_1$ and $111_2$ instead of the three pads $111_1$, $111_2$, and $111_3$ as terminals for the RF unit exchanging single-ended signals.

In a case where the single-ended I/F 111 includes the two pads $111_1$ and $111_2$, similarly to the case when the three pads $111_1$ to $111_3$ are included, a single-ended signal that the millimeter wave transmission chip 110 handles is still transmitted as a differential signal on the coplanar strip track 103.

It is therefore possible to perform good quality data transmission while suppressing an increase in the size of the circuit.

While it is possible to perform good quality data transmission while suppressing an increase in the size of the circuit by mounting the millimeter wave transmission chip 110 on the mounting unit 101 so that (the pads $111_1$ and $111_2$ of) the single-ended I/F 111 is directly electrically connected with (the conductors $103_1$ and $103_2$ configuring) the coplanar strip track 103 as described above, in a case where the coplanar strip track 103 which is the differential transmission path and the single-ended I/F 111 which is an I/F for single-ended signals are directly connected, impedance matching between the coplanar strip track 103 which is the differential transmission path and the single-ended I/F 111 which is the I/F for single-ended signals (match between the impedance of the coplanar strip track 103 and the impedance of the single-ended I/F 111) may pose a problem.

That is, the impedance of a differential transmission path is generally greater than the impedance of an I/F of single-ended signals, in a case where there is a large difference between the impedance of the differential transmission path and the impedance of the I/F of single-ended signals, good quality data transmission may be prevented by reflections due to the mismatch of impedances.

Therefore, the impedance of the differential transmission path (characteristic impedance) will be described.

Here, generally, the impedance of a differential transmission is path is approximately 120Ω, for example, and the impedance of an I/F of single-ended signals is approximately 50Ω, for example.

[Characteristic Impedance of Differential Transmission Path]

Figure 8:
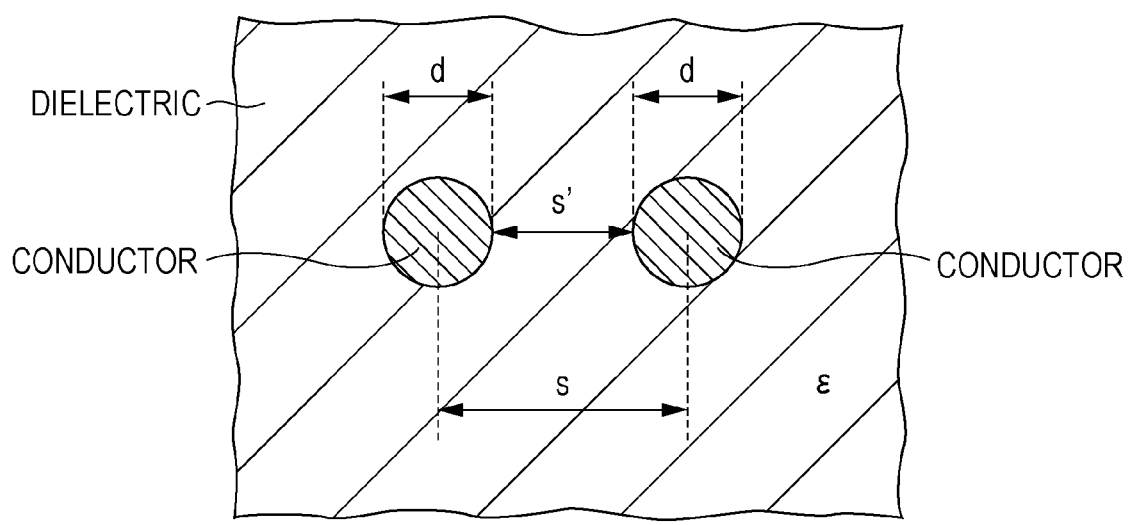
FIG. 8 is a cross-sectional view illustrating a differential transmission path.

FIG. 8 is a cross-sectional view illustrating a differential transmission path.

In FIG. 8, the differential transmission path is configured with the two bar-like conductors placed to be parallel being surrounded by a dielectric.

Here, in FIG. 8, the cross-sections of the bar-like conductors configuring the differential transmission path are circular.

Here, the diameter of the circular cross-sections of the conductors is represented by d, and the distance between the centers of the circles (center distance) is represented by s. Furthermore, a distance between the two conductors not including the two conductors (interval distance) is represented by s'(=s−d), the permittivity of the dielectric configuring the differential transmission path is represented by ∈, and the magnetic permeability is represented by μ.

An inductance L and a capacitance C of the differential transmission path of FIG. 8 per unit length are respectively represented by Formula 1 and Formula 2.

$$L = \frac{\mu}{\pi}\cosh^{-1}\left(\frac{s}{d}\right) \quad (1)$$

$$C = \frac{\pi\varepsilon}{\cosh^{-1}\left(\frac{s}{d}\right)} \quad (2)$$

Here, in order to simplify description, if it is assumed that the differential transmission path is lossless, the impedance (characteristic impedance) $Z_c$ of the differential transmission path of FIG. 8 is represented by Formula 3 using the inductance L of Formula 1 and the capacitance C of Formula 2.

$$Z_c = \sqrt{\frac{L}{C}} = \frac{1}{\pi}\sqrt{\frac{\mu}{\varepsilon}}\cosh^{-1}\left(\frac{s}{d}\right) \quad (3)$$

For example, here, if the impedance of the single-ended I/F 111 is 50Ω, in order to perform impedance matching with such a single-ended I/F 111, it is important that the impedance of the differential transmission path of FIG. 8 represented by Formula 3 be approximately 50Ω.

Here, if the relative permittivity $\in_r$ (=∈/$\in_0$ ($\in_0$ is the permittivity of a vacuum)) of the dielectric is 2.5, for example, in order for the impedance $Z_c$ of the differential transmission path of FIG. 8 represented by Formula 3 to be approximately 50Ω, it is important that s/d be approximately 1.23.

If the diameter of the circles of the cross-sections of the conductors are 50 μm, for example, for s/d to be approximately 1.23, it is important for the distance between the center of the circles (center distance) s to be 61.5 μm, and the distance between the circles without including the conductors (interval distance) s'(=s−d) is 11.5 μm.

FIG. 9 is a perspective view and a cross-sectional view illustrating the coplanar strip track 103 as the differential transmission path.

The cross-sections of the bar-like conductors $103_1$ and $103_2$ configuring the coplanar strip track 103 are substantially rectangular.

Here, the length (width) of the cross-sections of the conductors $103_1$ and $103_2$ are represented by w, and the distance between (the cross-sections of) the conductors $103_1$ and $103_2$ without including the conductors $103_1$ and $103_2$ (interval distance) is represented by s.

Further, the relative permittivity of the mounting unit 101 as the dielectric on which the conductors $103_1$ and $103_2$ is represented by $\in_r$, and the thickness (the distance between the front face and the reverse face) of the mounting unit 101 is represented by h.

The impedance (characteristic impedance) $Z_c$ of the coplanar strip track 103 is represented by Formula 4.

$$Zc = \frac{120\pi}{\sqrt{\varepsilon_e}} \frac{K(k)}{K(k')} \quad (4)$$

Here, in Formula 4, $\varepsilon_e$ is represented by Formula 5.

$$\varepsilon_e = 1 + \frac{\varepsilon_r - 1}{2} \frac{K(k')K(k_1)}{K(k)K(k'_1)} \quad (5)$$

Further, k of Formulae 4 and 5 is represented by Formula 6, and $k_1$ of Formula 5 is represented by Formula 7.

$$k=a/b, \ a=s/2, \ b=s/2+w, \quad (6)$$

$$k_1 = \sin h(\pi a/2h)/\sin h(\pi b/2h) \quad (7)$$

Furthermore, K(k)/K'(k) of Formulae 4 and 5 is represented by Formula 8.

$$\frac{K(k)}{K'(k)} = \begin{cases} \left[\frac{1}{\pi}\ln\left(2\frac{1+\sqrt{k'}}{1-\sqrt{k'}}\right)\right]^{-1} & \text{for } 0 \leq k \leq 0.7 \\ \frac{1}{\pi}\ln\left(2\frac{1+\sqrt{k}}{1-\sqrt{k}}\right) & \text{for } 0.7 \leq k \leq 1 \end{cases} \quad (8)$$

Further, functions K(k') and K'(k) and values k and k' have the relationship shown in Formula 9.

$$K'(k)=K(k'), \ k'=\sqrt{1-k^2} \quad (9)$$

Here, values $k_1$ and $k'_1$ also have the same relationship as the values k and k'.

Here, if the mounting unit 101 is a generic FR-4 substrate (glass epoxy substrate), the relative permittivity $\varepsilon_r$ of the mounting unit 101 is approximately 4.0, and a thickness h of the mounting unit 101 is approximately 1.6 mm.

Furthermore, if a width w of the conductors $103_1$ and $103_2$ is 50 μm, for example, for the impedance of the coplanar strip track 103 to be approximately 50Ω, it is important for the interval distance s between the conductors $103_1$ and $103_2$ to be approximately 0.23 μm.

Incidentally, while it is predicted that it will be easier in the future for the interval distance between the conductors $103_1$ and $103_2$ to be made to be approximately 0.23 μm due to technological developments, given the present high density wiring technologies, it is difficult for the width w and the interval distance s of the conductors $103_1$ and $103_2$ to be a value of approximately 0.23 μm which is significantly less than approximately 50 μm.

Therefore, for example, in a case where approximately 50 μm is adopted as the width w and the interval distance s of the conductors $103_1$ and $103_2$, the impedance of the coplanar strip track 103 is greater than 50Ω which is the impedance of the single-ended I/F 111 by approximately several tens of Ω, and in such a case, the mismatch between the impedances of the coplanar strip track 103 and the single-ended I/F 111 may pose a problem.

Third Embodiment

Accordingly, FIG. 10 is a perspective view illustrating a configuration example of a third embodiment of the electronic circuit to which the embodiments of the present technology are applied.

Here, in the drawing, the same symbols are given to portions corresponding to the case of the first embodiment of FIG. 4, and description thereof will be omitted below as appropriate.

The third embodiment of FIG. 10 differs from the case of FIG. 4 in that a dielectric 130 is placed on the coplanar strip track 103.

The dielectric 130 is a dielectric with a greater permittivity than the permittivity of the mounting unit 101 (for example, a dielectric with a permittivity of approximately 10), and by the dielectric 130 with such a large permittivity being placed on the coplanar strip track 103, the impedance $Z_c$ of the coplanar strip track 103 represented by Formula 4 is able to be made smaller than a case where the dielectric 130 is not placed.

Therefore, by adopting a dielectric with a permittivity making the impedance $Z_c$ of the coplanar strip track 103 smaller and matching the impedances of the coplanar strip track 103 and the single-ended I/F 111 as the dielectric 130, the impedances of the coplanar strip track 103 and the single-ended I/F 111 are matched, and it is possible to prevent good quality data transmission being hindered by reflection due to a mismatch of impedances.

Here, in FIG. 10, assuming that the dielectric 130 is colorless and transparent, the conductors $103_1$ and $103_2$ configuring the coplanar strip track 103 are shown so that the conductors $103_1$ and $103_2$ are able to be seen through the dielectric 130.

Figure 11A:
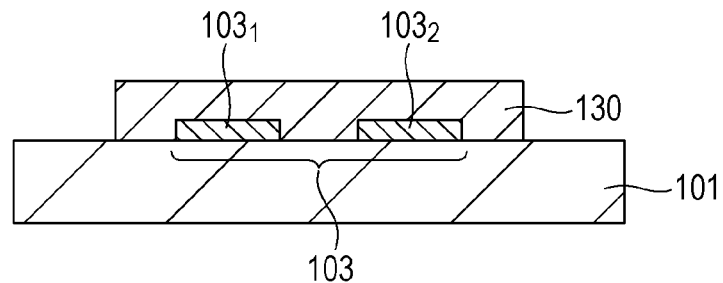
FIGS. 11A to 11C are views describing examples of an placement pattern of placing a dielectric on the coplanar strip track.
Figure 11B:
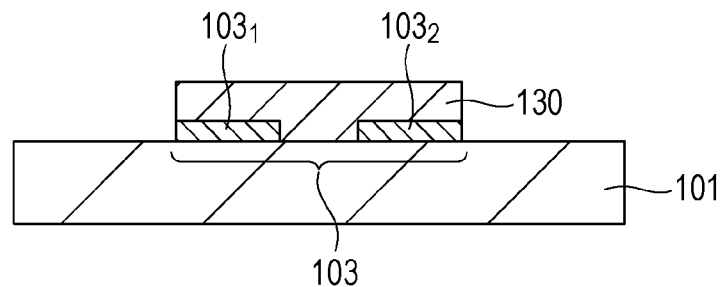
Figure 11C:
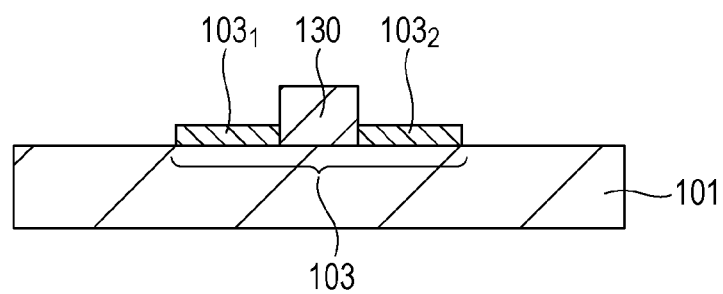

FIGS. 11A to 11C are views describing examples of the placement pattern of placing the dielectric 130 on the coplanar strip track 103.

Here, FIGS. 11A to 11C illustrate cross-sections of electronic circuits in which the dielectric 130 is placed on the coplanar strip track 103.

FIGS. 11A to 11C respectively illustrate a first placement pattern, a second placement pattern, and a third placement pattern.

In the first placement pattern (FIG. 11A), the dielectric 130 is placed along the two conductors $103_1$ and $103_2$ of the coplanar strip track 103, and has a width able to cover the entire area from one conductor $103_1$ of the two conductors $103_1$ and $103_2$ to the other conductor $103_2$.

In the second placement pattern (FIG. 11B), the dielectric 130 is placed along the two conductor $103_1$ and $103_2$ of the coplanar strip track 103, and has the same width as the distance between the two conductors $103_1$ and $103_2$ including the two conductors $103_1$ and $103_2$.

In the third placement pattern (FIG. 11C), the dielectric 130 is placed along the two conductors $103_1$ and $103_2$ of the coplanar strip track 103 between the two conductors $103_1$ and $103_2$, and has the same width as the distance between the two conductors $103_1$ and $103_2$ not including the two conductors $103_1$ and $103_2$ (interval distance).

Here, while in the electronic circuit of FIG. 10, the impedances of the coplanar strip track 103 and the single-ended I/F 111 are matched by adjusting to reduce the impedance $Z_c$ of the coplanar strip track 103 by placing the dielectric 130 on the coplanar strip track 103, the adjustment to reduce the impedance $Z_c$ of the coplanar strip track 103 is otherwise able to be performed by a method other than placing the dielectric 130 on the coplanar strip track 103.

FIG. 12 is a view describing another method of performing an adjustment to decrease the impedance of the coplanar strip track 103.

That is, FIG. 12 is a cross-sectional view illustrating a configuration example of a mounting unit 101 on which the conductors $103_1$ and $103_2$ configuring the coplanar strip track 103 are formed.

In FIG. 12, the capacitance of the coplanar strip track 103 is increased by thickening the thicknesses of the conductors $103_1$ and $103_2$, and as a result, the impedance $Z_c$ of the coplanar strip track 103 is adjusted to be reduced compared to a case where the thicknesses of the conductors $103_1$ and $103_2$ are not thickened.

That is, by thickening the thicknesses of the conductors $103_1$ and $103_2$, the impedances of the coplanar strip track 103 and the single-ended I/F 111 are able to be matched without placing the dielectric 130 on the coplanar strip track 103.

Figure 13:
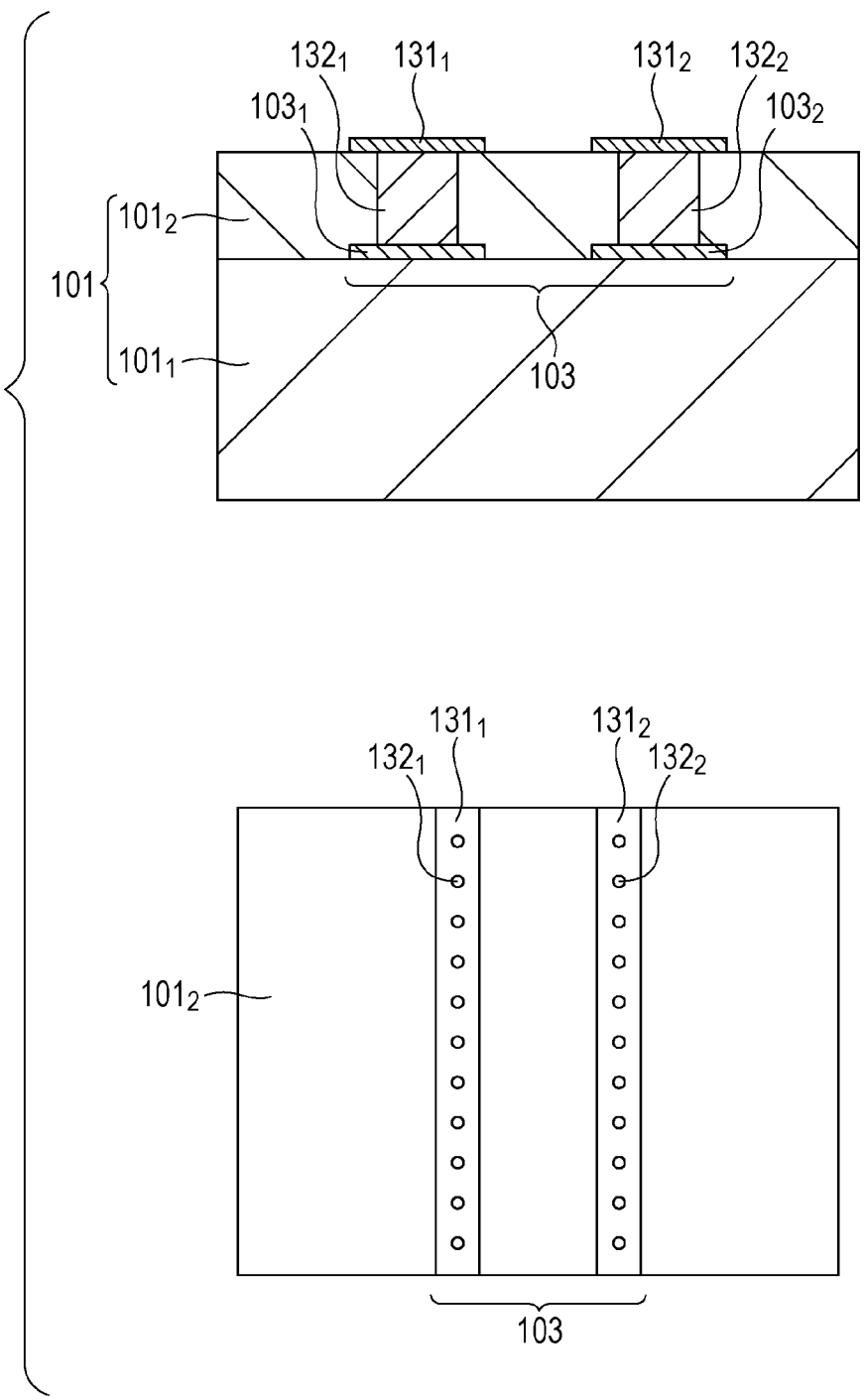
FIG. 13 is a view describing another method of performing an adjustment to decrease the impedance of the coplanar strip track.

FIG. 13 is a view describing still another method of performing an adjustment to reduce the impedance $Z_c$ of the coplanar strip track 103.

That is, FIG. 13 is a cross-sectional view and a plan view illustrating a configuration example of a mounting unit 101 on which the conductors $103_1$ and $103_2$ configuring the coplanar strip track 103 are formed.

In FIG. 13, the mounting unit 101 has a two-layered structure with a first layer $101_1$ and a second layer $101_2$, and the two conductors $103_1$ and $103_2$ placed to be parallel configuring the coplanar strip track 103 are formed on the front face (upper face) of the first layer $101_1$.

Further, the two conductors $131_1$ and $131_2$ placed to be parallel configuring the coplanar strip track 103 are also formed on the front face (upper face) of the second layer $101_2$ to be respectively parallel with the two conductors $103_1$ and $103_2$.

Furthermore, a via $132_1$ electrically connecting the conductor $103_1$ with the conductor $131_1$ is provided on the conductor $103_1$ of the first layer $101_1$ and the conductor $131_1$ of the second layer $101_2$ placed to be parallel.

Similarly, a via $132_2$ electrically connecting the conductor $103_2$ with the conductor $131_2$ is provided on the conductor $103_2$ of the first layer $101_1$ and the conductor $131_2$ of the second layer $101_2$ placed to be parallel.

As described above, similarly to the case of FIG. 12, the capacitance of the coplanar strip track 103 is also increased by configuring the conductors configuring the coplanar strip track 103 to be multi-layered, and as a result, the impedance $Z_c$ of the coplanar strip track 103 is able to be adjusted to be reduced.

Here, while in FIG. 13, the two conductors $103_1$ and $103_2$ configuring the coplanar strip track 103 are formed on the first layer $101_1$ of the mounting unit 101 configured to be two-layered and the two conductors $131_1$ and $131_2$ configuring the coplanar strip track 103 are formed on the second layer $101_2$, the impedance $Z_c$ of the coplanar strip track 103 is also able to be reduced by configuring the mounting unit 101 with three or more layers, forming two conductors configuring the coplanar strip track 103 to be layer-like on each layer of the three or more layers, and electrically connecting the conductors using a via.

Further, it is possible to perform the adjustment of reducing the impedance $Z_c$ of the coplanar strip track 103 by using a method of placing the dielectric 130 on the coplanar strip track 103 and the method described in FIGS. 12 and 13 together.

Furthermore, as described in FIG. 9, it is possible to perform the adjustment of reducing the impedance $Z_c$ of the coplanar strip track 103 by narrowing the interval distance s between the conductors $103_1$ and $103_2$.

Fourth Embodiment

Figure 14:
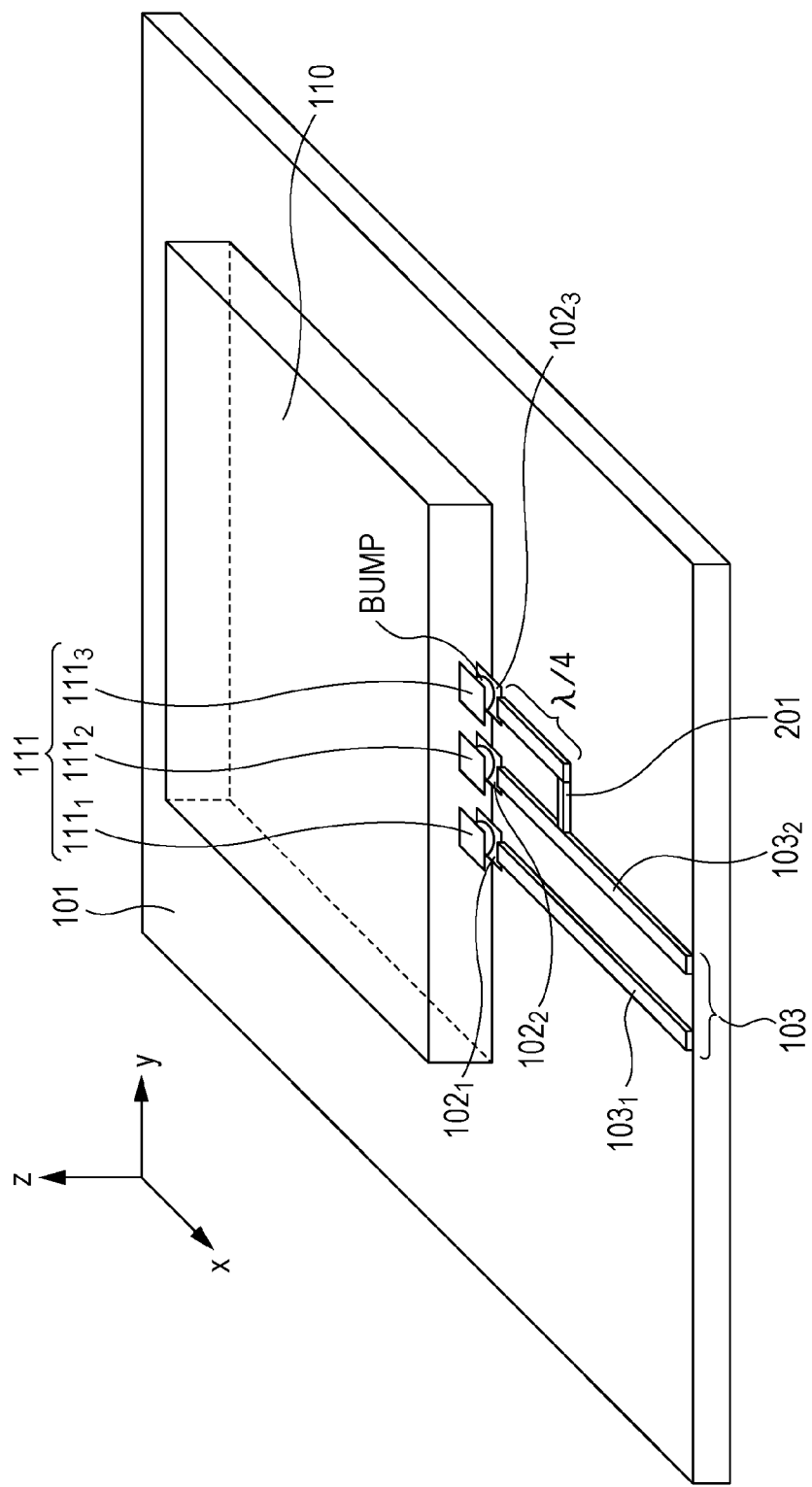
FIG. 14 is a perspective view illustrating a configuration example of a fourth embodiment of the electronic circuit to which the embodiments of the present technology are applied.
Figure 15:
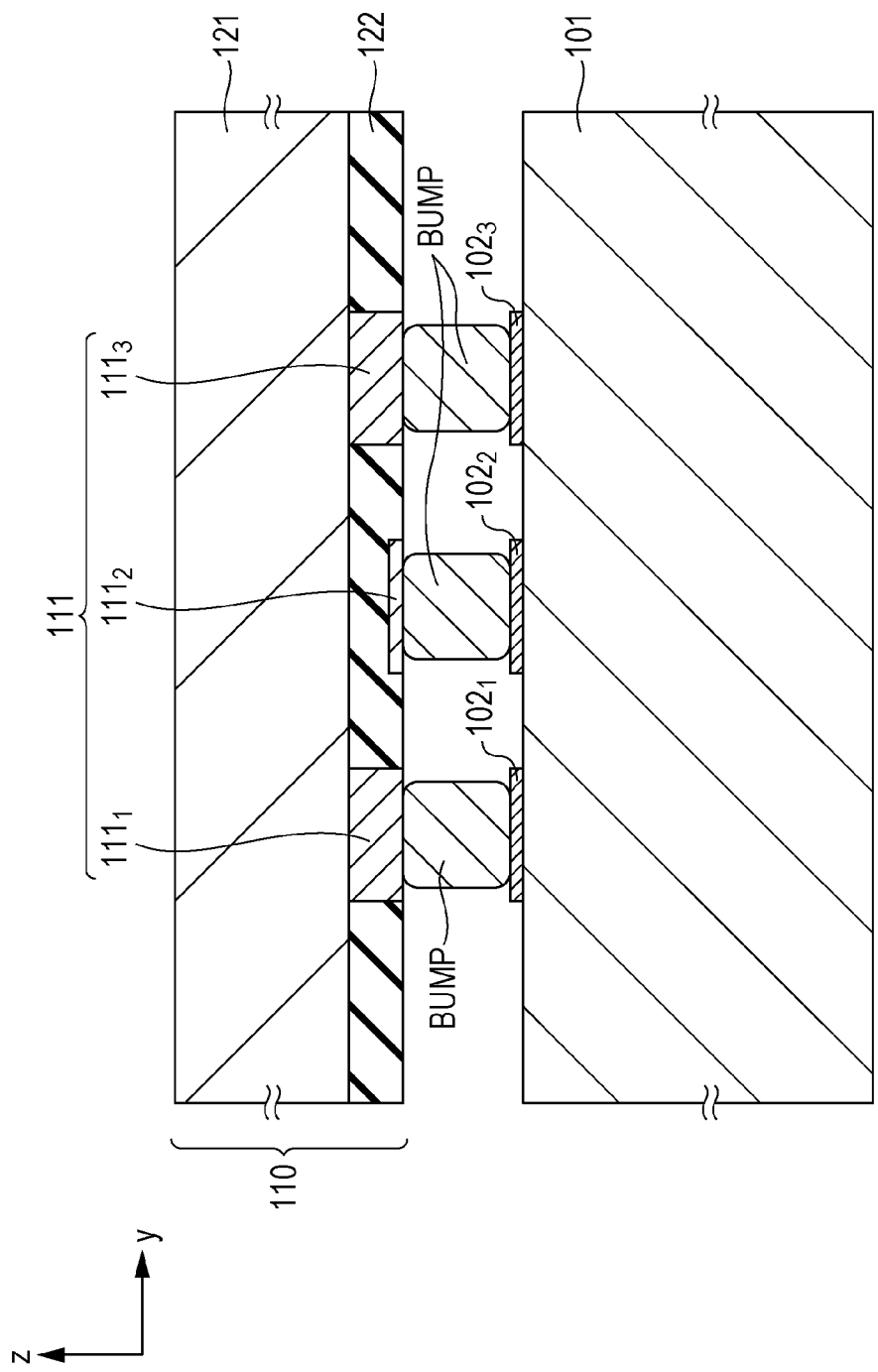
FIG. 15 is a cross-sectional view illustrating a configuration example of the fourth embodiment of the electronic circuit to which the embodiments of the present technology are applied.

FIG. 14 is a perspective view illustrating a configuration example of a fourth embodiment of the electronic circuit to which the embodiments of the present technology are applied, and FIG. 15 is a cross-sectional view of the portion of the single-ended I/F 111 of the electronic circuit of FIG. 14.

Here, in the drawings, the symbols are given to portions corresponding to the case of the first embodiment of FIGS. 4 and 5, and description thereof will be omitted below as appropriate.

The fourth embodiment of FIGS. 14 and 15 differ from the case of FIGS. 4 and 5 in that a land $102_3$ is provided on the mounting unit 101 in addition to the lands $102_1$ and $102_2$, and in that a stub 201 is provided.

Here, in FIG. 14, similarly to the case of FIG. 4, while the lands $102_1$ and $102_2$, the pads $111_1$ to $111_3$, and bumps, as well as the land $102_3$ are in actuality hidden from view by the millimeter wave transmission chip 110, in FIG. 14, it is assumed that the millimeter wave transmission chip 110 is colorless and transparent, and the lands $102_1$ to $102_3$, the pads $111_1$ to $111_3$, and the bumps are shown in the drawings to be visible.

While the pad $111_3$ which is a grounded terminal of the single-ended I/F 111 is not shown in either FIG. 4 nor FIG. 5, in FIGS. 14 and 15, the pad $111_3$ and the stub 201 are connected via the land $102_3$ and a bump.

The stub 201 is an L-shaped conductor, and is formed on the mounting unit 101.

One end of the L-shaped stub 201 is connected to the conductor $103_2$ connected to the pad $111_2$ as a signal terminal via the land $102_2$ configuring the coplanar strip track 103 and a bump.

Further, the other end of the L-shaped stub 201 is connected to the land $103_3$.

Here, the land $103_3$ is connected to the pad $111_3$ which is not connected to the conductor $103_1$ configuring the coplanar strip track 103 out of the two pads $111_1$ and $111_3$ which are grounded terminals of the single-ended I/F 111.

Therefore, since the other end of the stub 201 is connected to a ground, the stub 201 is a short stub.

Further, the length of the L-shaped stub 201 is λ/4 which is one quarter of the length of a wavelength λ of an RF signal (millimeter wave) transmitted via the coplanar strip track 103 configured by the conductor $103_2$ to which the stub 201 is connected.

The stub 201 which is a short stub with a length of λ/4 functions as a BPF (Band Pass Filter), and as a result, it is possible to remove low-frequency noise, and further, it is possible to reduce common mode noise on the coplanar strip track 103 and to improve the passage characteristics of a differential mode (normal mode).

Further, for example, in a case where an electrical surge occurs on the conductor $103_2$, since the surge is able to be led to the ground via the stub 201, ESD (Electro-Static Discharge) resistance is able to be improved.

Here, the electronic circuit of FIGS. 14 and 15 is able to be manufactured by respectively directly electrically connecting the pads $111_1$ and $111_2$ of the single-ended I/F 111 to the conductors $103_1$ and $103_2$ configuring the coplanar strip track 103 when mounting the millimeter wave transmission chip 110 on which the single-ended I/F 111 is provided on the mounting unit 101 on which the coplanar strip track 103 and the stub 201 are formed, and directly electrically connecting the pad $111_3$ of the single-ended I/F 111 to the end portion of the stub 201 not connected to the conductor $103_2$ (other end).

Further, since the distance between the pads $111_2$ and $111_3$ which are adjacent on the single-ended I/F 111 of the millimeter wave transmission chip is a distance that is able to be ignored for the λ/4 of the millimeter waves, in FIG. 14, with regard to the sub 201, other than making the overall length of the stub 201 λ/4, the length of a portion parallel to a straight line linking the pads $111_2$ and $111_3$ of the L-shaped stub 201 is able to be λ/4.

Fifth Embodiment

Figure 16:
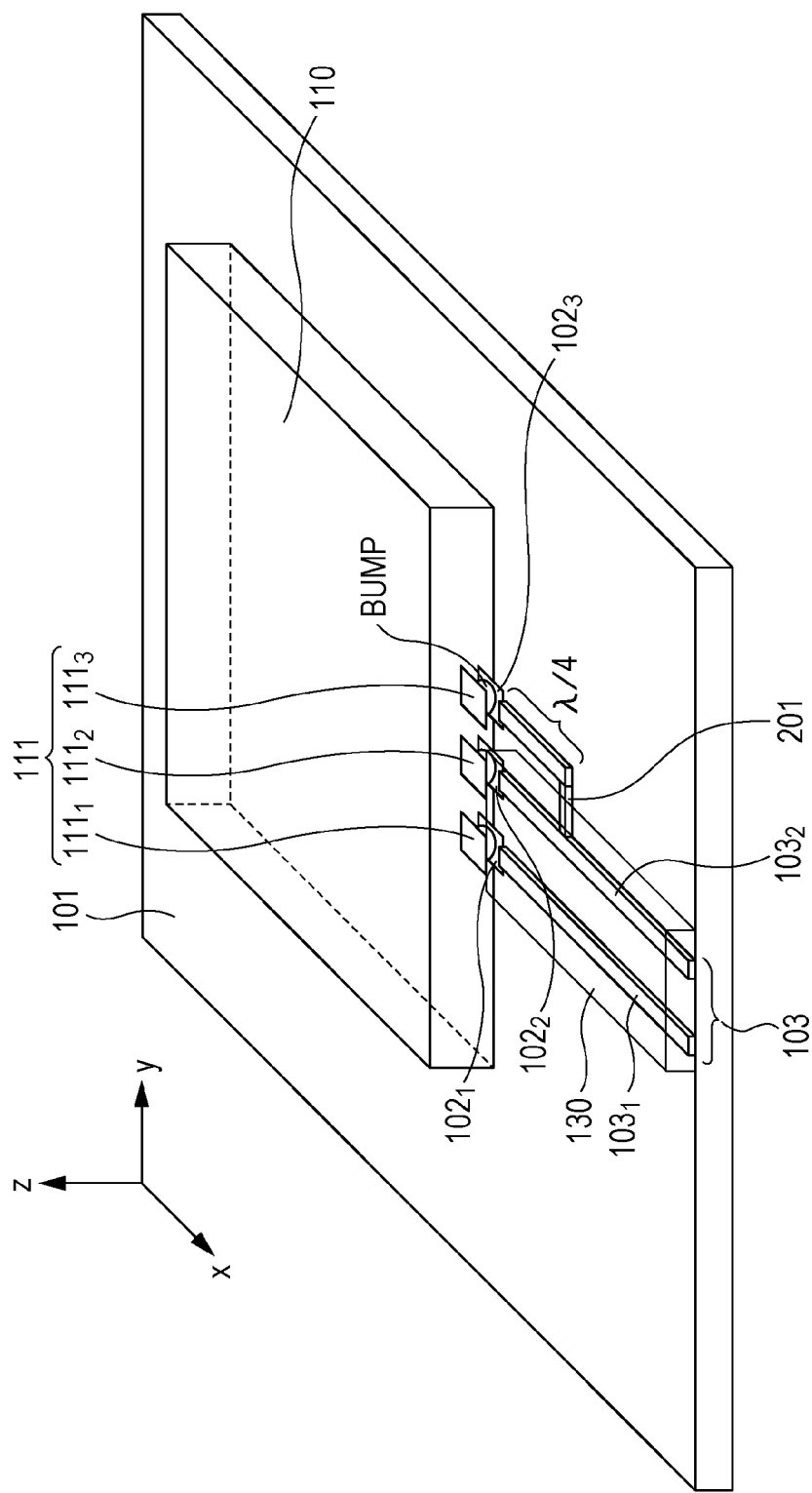
FIG. 16 is a perspective view illustrating a configuration example of a fifth embodiment of the electronic circuit to which the embodiments of the present technology are applied.

FIG. 16 is a perspective view illustrating a configuration example of a fifth embodiment of the electronic circuit to which the embodiments of the present technology are applied.

Here, in the drawing, the same symbols are given to portions corresponding to the case of the third embodiment of FIG. 10 and the case of the fourth embodiment of FIGS. 14 and 15, and description thereof will be omitted below as appropriate.

The fifth embodiment of FIG. 16 differs from the case of FIGS. 14 and 15 in that the dielectric 130 described in FIG. 10 is placed on the coplanar strip track 103.

As described in FIG. 10, the dielectric 130 is a dielectric with a greater permittivity than the permittivity of the mounting unit 101, and by the permittivity 130 with such a large permittivity being placed on the coplanar strip track 103, the impedance $Z_c$ of the coplanar strip track 103 represented by Formula 4 is able to be made smaller than a case where the dielectric 130 is not placed.

As a result, the impedances of the coplanar strip track 103 and the single-ended I/F 111 are matched, and it is possible to prevent good quality data transmission from being hindered by reflections due to a mismatch of impedances.

Here, in addition to the method of placing the dielectric 130, the matching of the impedances of the coplanar strip track 103 and the single-ended I/F 111 is possible using, for example, the method described in FIGS. 12 and 13, or the like.

Figure 17:
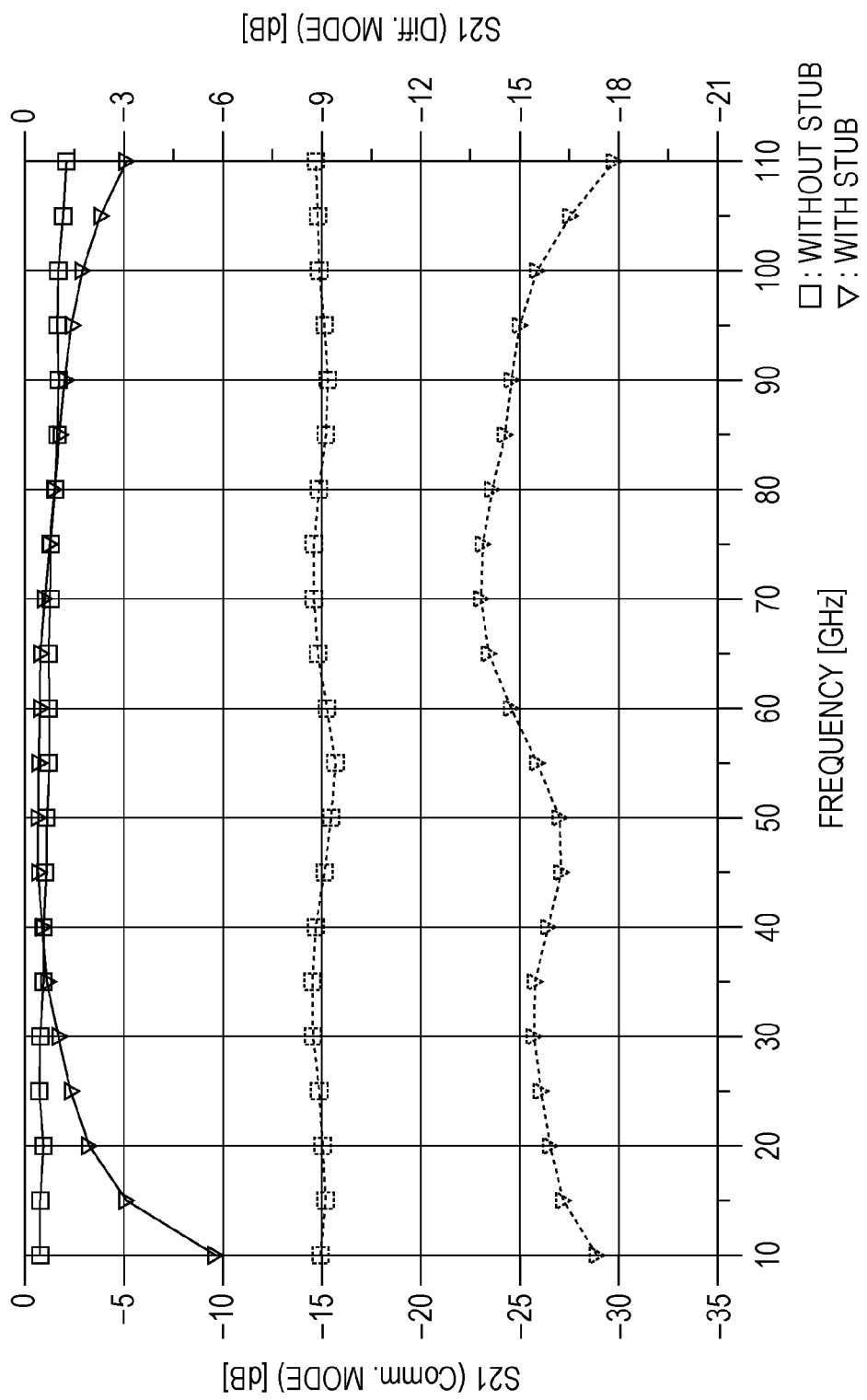
FIG. 17 is a view illustrating the results of a simulation.

FIG. 17 is a view illustrating the results of a simulation performed on the electronic circuit of FIG. 16.

That is, FIG. 17 illustrates an S parameter $S_{21}$ of the electronic circuit of FIG. 16 (also referred to as a with-stub circuit) and the S parameter $S_{21}$ of a circuit in which the stub 201 is removed from the electronic circuit of FIG. 16 (hereinafter also referred to as a without-stub circuit).

Here, in FIG. 17, the horizontal axis represents the frequency, and the vertical axis represents the S parameter $S_{21}$.

Further, in FIG. 17, the solid line represents the S parameter $S_{21}$ of the differential mode of the coplanar strip track 103, and the dotted line represents the S parameter $S_{21}$ of the common mode.

Furthermore, in FIG. 17, triangles represent the S parameter $S_{21}$ of a with-stub circuit, and squares represent the S parameter $S_{21}$ of a without-stub circuit.

According to FIG. 17, the S parameter $S_{21}$ of the differential mode (indicated by triangles and a solid line) is high in a frequency band centered around 60 GHz compared to a frequency band with equal to or greater than 90 GHz or a frequency band with equal to or less than 30 GHz, and therefore, in a case where the stub 201 is present, a frequency band centered around 60 GHz in the differential mode, that is, the passage characteristics (transmission characteristics) of a millimeter wave band are able to be improved.

Sixth Embodiment

Figure 18:
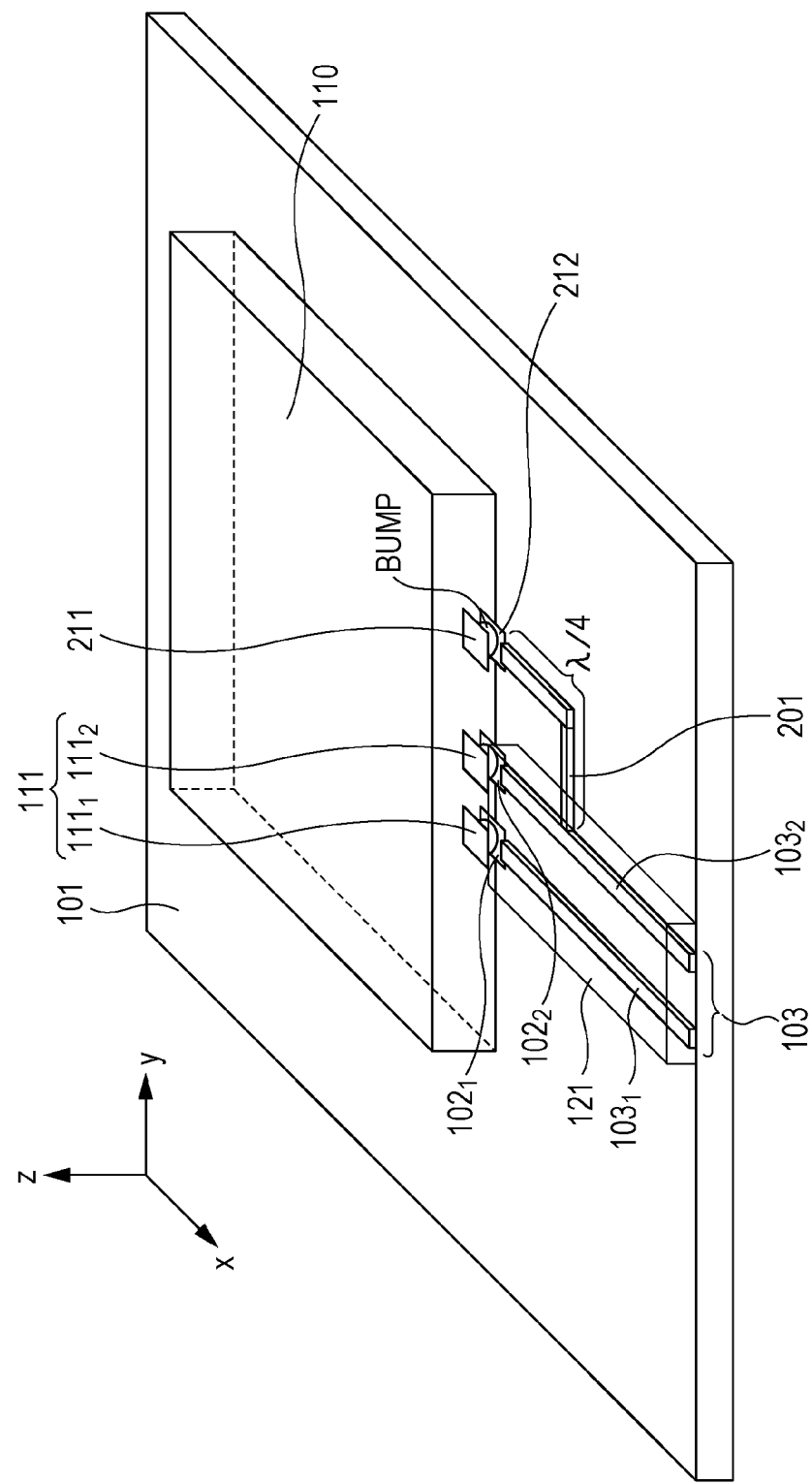
FIG. 18 is a perspective view illustrating a configuration example of a sixth embodiment of the electronic circuit to which the embodiments of the present technology are applied.
Figure 19:
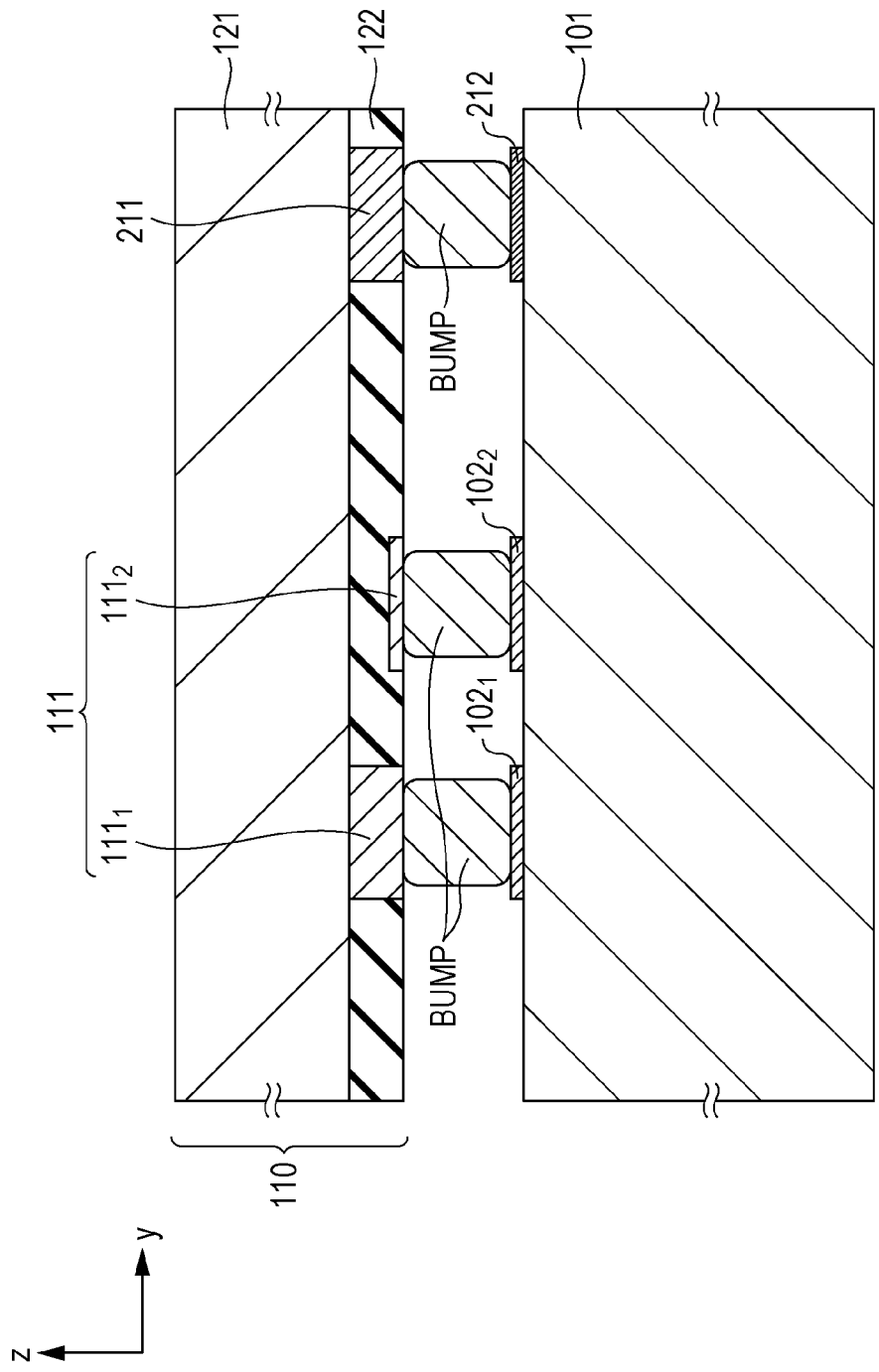
FIG. 19 is a cross-sectional view illustrating a configuration example of the sixth embodiment of the electronic circuit to which the embodiments of the present technology are applied.

FIG. 18 is a perspective view illustrating a configuration example of a sixth embodiment of the electronic circuit to which the embodiments of the present technology are applied, and FIG. 19 is a cross-sectional view of the portion of the single-ended I/F 111 of the electronic circuit of FIG. 18.

Here, in the drawings, the same symbols are given to portions corresponding to the case of the second embodiment of FIGS. 6 and 7, the fourth embodiment of FIGS. 14 and 15, and the fifth embodiment of FIG. 16, and description thereof will be omitted below as appropriate.

Similarly to the case of FIGS. 6 and 7, the sixth embodiment of FIGS. 18 and 19 differ from the case of the fifth embodiment of FIG. 16 in that only the single-ended I/F 111 only includes two pads $111_1$ and $111_2$ instead of the three pads $111_1$, $111_2$, and $111_3$ as terminals for an RF unit (not shown) built into the millimeter wave transmission chip 110 exchanging single-ended signals.

As described above, in the sixth embodiment of FIGS. 18 and 19, since the single-ended I/F 111 includes the two pads $111_1$ and the $111_2$ but does not include the pad $111_3$ which is a grounded terminal, the other end of the stub 201 is connected to a passo 211 which is another grounded terminal of the millimeter wave transmission chip 110.

That is, in FIGS. 18 and 19, the pad 211 which is a different grounded terminal from the pad $111_1$ which is a grounded terminal configuring the single-ended I/F 111 provided on the millimeter wave transmission chip 110 is shown.

Furthermore, in FIGS. 18 and 19, a land 212 formed at a position on the mounting unit 101 corresponding to the pad 211 of the millimeter wave transmission chip 110 when the millimeter wave transmission chip 110 is mounted on the mounting unit 101 and a position relatively apart from the single-ended I/F 111 is shown.

In the sixth embodiment of FIGS. 18 and 19, on the mounting unit 101, the other end of the L-shaped stub 201 of which one end is connected to the conductor $103_2$ is connected to the land 212.

Furthermore, in the sixth embodiment of FIGS. 18 and 19, the pad 211 of the millimeter wave transmission chip and the land 212 of the mounting unit 101 are connected via a bump, and therefore, the other end of the L-shaped stub 201 of which one end is connected to the conductor $103_2$ is connected to a ground via the land 212, a bump, and the pad 211.

Even in a case where the other end of the L-shaped stub 201 of which one end if connected to the conductor $103_2$ is connected to the pad 211 which is a grounded terminal not configuring the single-ended I/F 111 of the millimeter wave transmission chip 110 as described above, similarly to a case where the other end of the L-shaped stub 201 of which one end is connected to the conductor $103_2$ is connected to the pad $111_3$ which is a grounded terminal configuring the single-ended I/F 111 of the millimeter wave transmission chip 110 (FIGS. 14, 15, and 16), it is possible to remove low-frequency noise on the coplanar strip track 103, reduce common mode noise, improve the passage characteristics of the differential mode, and improve ESD resistance.

Here, as described in FIGS. 14 and 15, the length of the L-shaped stub 201 is λ/4.

Since the distance between the pad $111_2$ of the single-ended I/F 111 of the millimeter wave transmission chip 110 and the pad 211 which is a grounded terminal not configuring the single-ended I/F 111 is not a distance that is able to be ignored for the λ/4 of the millimeter waves as with the distance between the adjacent pads $111_2$ and $111_3$ of the single-ended I/F 111, in FIG. 18, for the L-shaped stub 201, it is important for the overall length of the stub 201 to be λ/4.

While common mode noise is able to be reduced by providing the stub 201 with a length of λ/4 as described above, an embodiment of reducing common mode noise by another method will be described.

Seventh Embodiment

Figure 20:
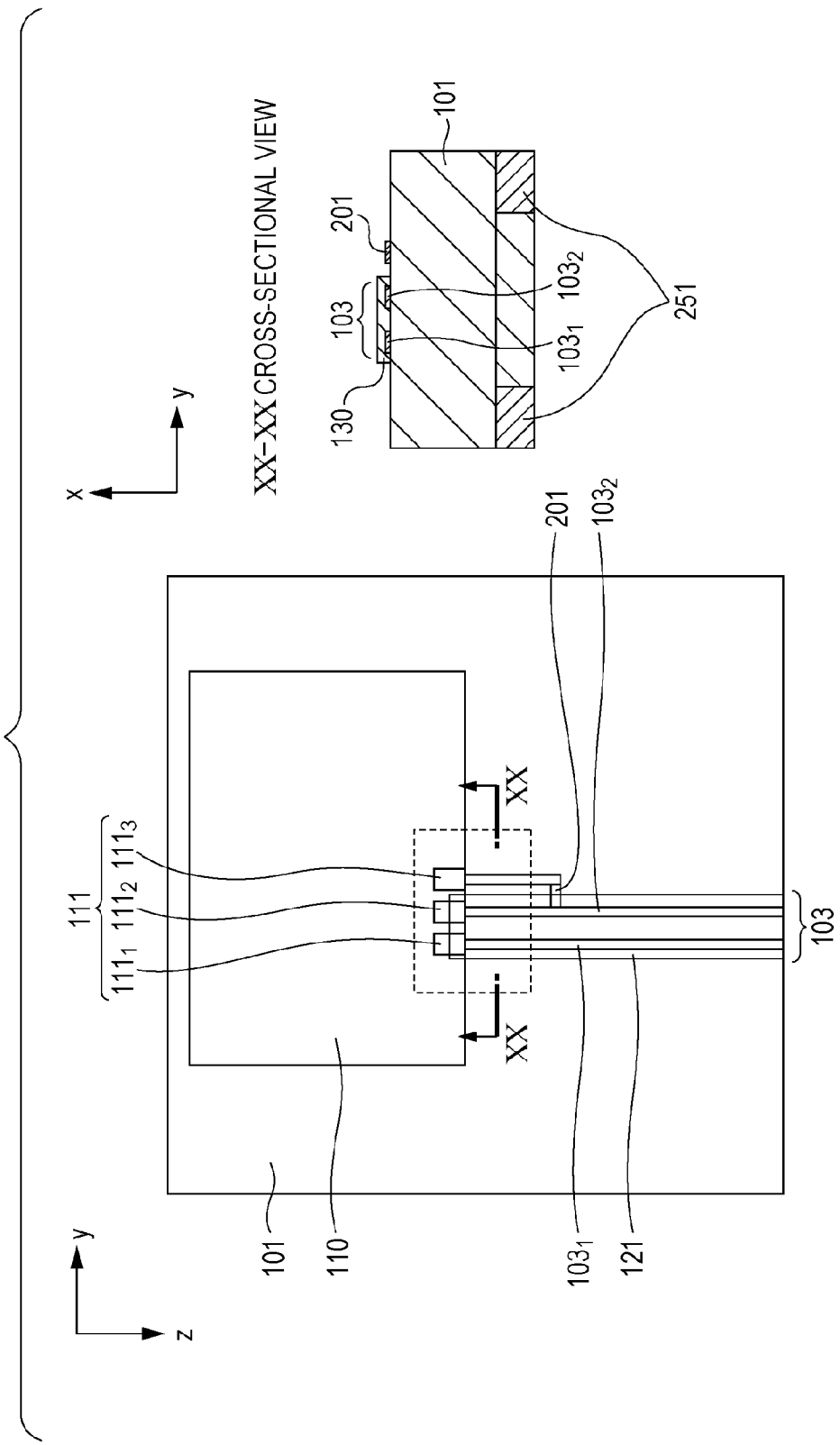
FIG. 20 is an upper view and a cross-sectional view illustrating a configuration example of a seventh embodiment of the electronic circuit to which the embodiments of the present technology are applied.

FIG. 20 is an upper view (plan view) and a cross-sectional view illustrating a configuration example of a seventh embodiment of the electronic circuit to which the embodiments of the present technology are applied.

Herein in the drawing, the same symbols are given to portions corresponding to the fifth embodiment of FIG. 16, and description thereof will be omitted below as appropriate.

Further, in FIG. 20 (as with FIG. 22 described later), the grounded metal provided on the reverse face of the mounting unit 101 omitted in the drawings of the first embodiment to the sixth embodiment described above is shown as a grounded metal 251.

In the seventh embodiment, a thin metallic film as the grounded metal 251 is provided in an area on the reverse face side of the mounting unit 101 excluding at least an area corresponding to a portion where the conductors $103_1$ and $103_2$ configuring the coplanar strip track 103 are connected with the pads $111_1$ and $111_2$ of the single-ended I/F 111.

Therefore, in the seventh embodiment, there is no thin metallic film as the grounded metal 251 at an area on the reverse face side of the mounting unit 101 corresponding to a portion where the conductors $103_1$ and $103_2$ configuring the coplanar strip track 103 are connected with the pads $111_1$ and $111_2$ of the single-ended I/F 111.

Here, the grounded metal 251 as shown in FIG. 20 is able to be configured, for example, by providing a thin metallic film on the entirety of the reverse side of the mounting unit 101 before removing the metal of a rectangular area including an area corresponding to the pads $111_1$ to $111_3$ of the single-ended I/F 111.

As described above, by proving a metal as the grounded metal 251 in an area on the reverse face side of the mounting unit 101 excluding at least the area corresponding to the portion where the conductors $103_1$ and $103_2$ configuring the coplanar strip track 103 are connected with the pads $111_1$ and $111_2$ of the single-ended I/F 111, that is, by not providing a ground in an area on the reverse side of the mounting unit 101 corresponding to the portion where the conductors $103_1$ and $103_2$ and the pads $111_1$ and $111_2$ are connected, common mode noise on the coplanar strip track 103 is able to be suppressed.

Figure 21:
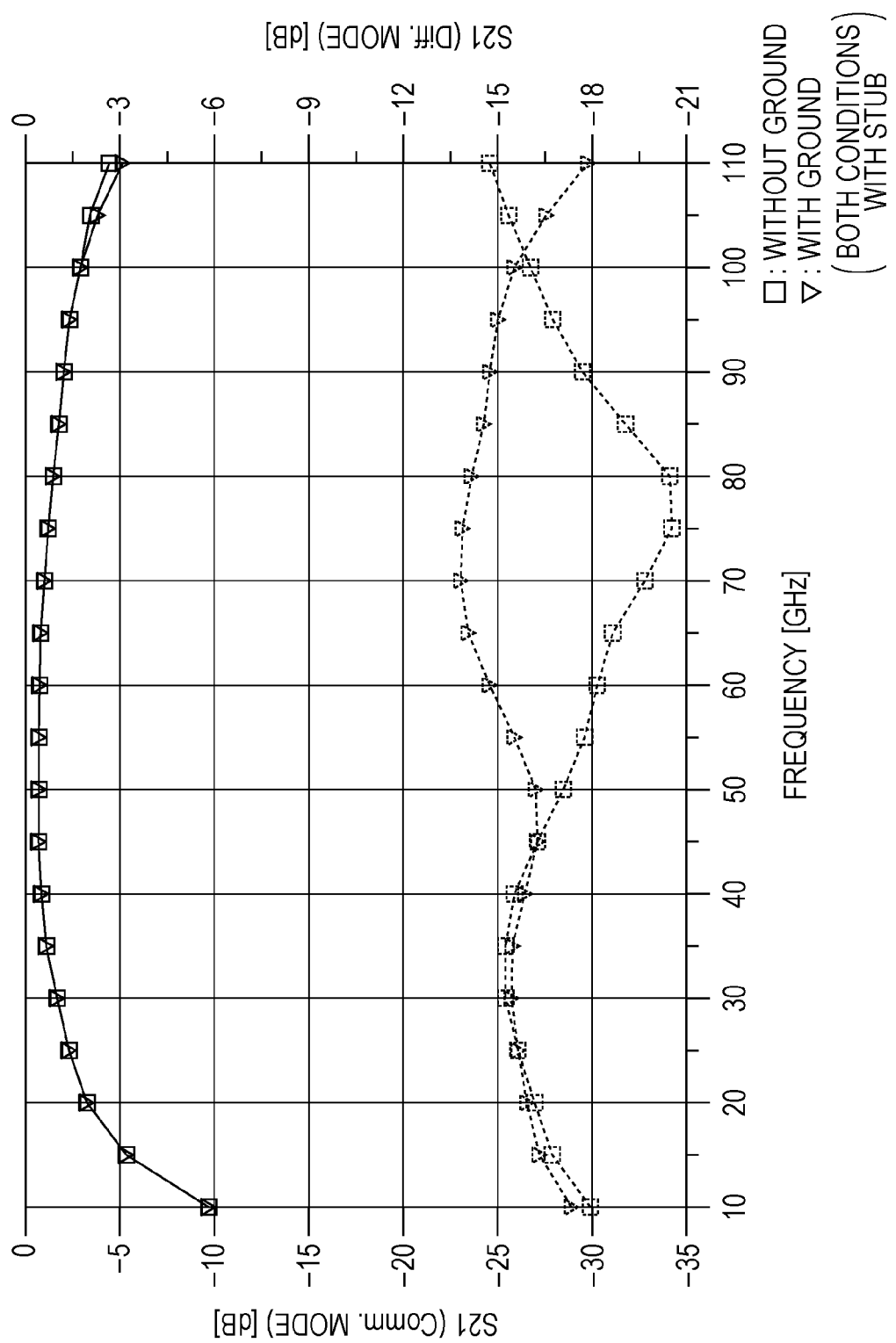
FIG. 21 is a view illustrating the results of a simulation.

That is, FIG. 21 is a view illustrating the results of a simulation performed on the electronic circuit of FIG. 20.

Here, FIG. 21 illustrates the S parameter $S_{21}$ of the electronic circuit of FIG. 20 (hereinafter also referred to as a without-ground circuit) and the S parameter $S_{21}$ of a circuit in which a metal as a ground is provided in an area of the electronic circuit of FIG. 20 on the reverse side of the mounting unit 101 where the grounded metal 251 is not present (hereinafter also referred to as a with-ground circuit).

Here, in FIG. 21, the solid line represents the S parameter $S_{21}$ of the differential mode of the coplanar strip track 103, and the dotted line represents the S parameter $S_{21}$ of the common mode.

Furthermore, in FIG. 21, triangles represent the S parameter $S_{21}$ of a with-ground circuit, and squares represent the S parameter $S_{21}$ of a without-ground circuit.

According to FIG. 21, the S parameter $S_{21}$ of the common mode of the without-ground circuit (indicated by squares and the dotted line) is less than the case of the with-ground circuit (indicated by triangles and the dotted line) at a millimeter waveband of approximately 50 GHz to 100 GHz, and it is possible to verify that millimeter waveband common mode noise is able to be suppressed.

Eighth Embodiment

Figure 22:
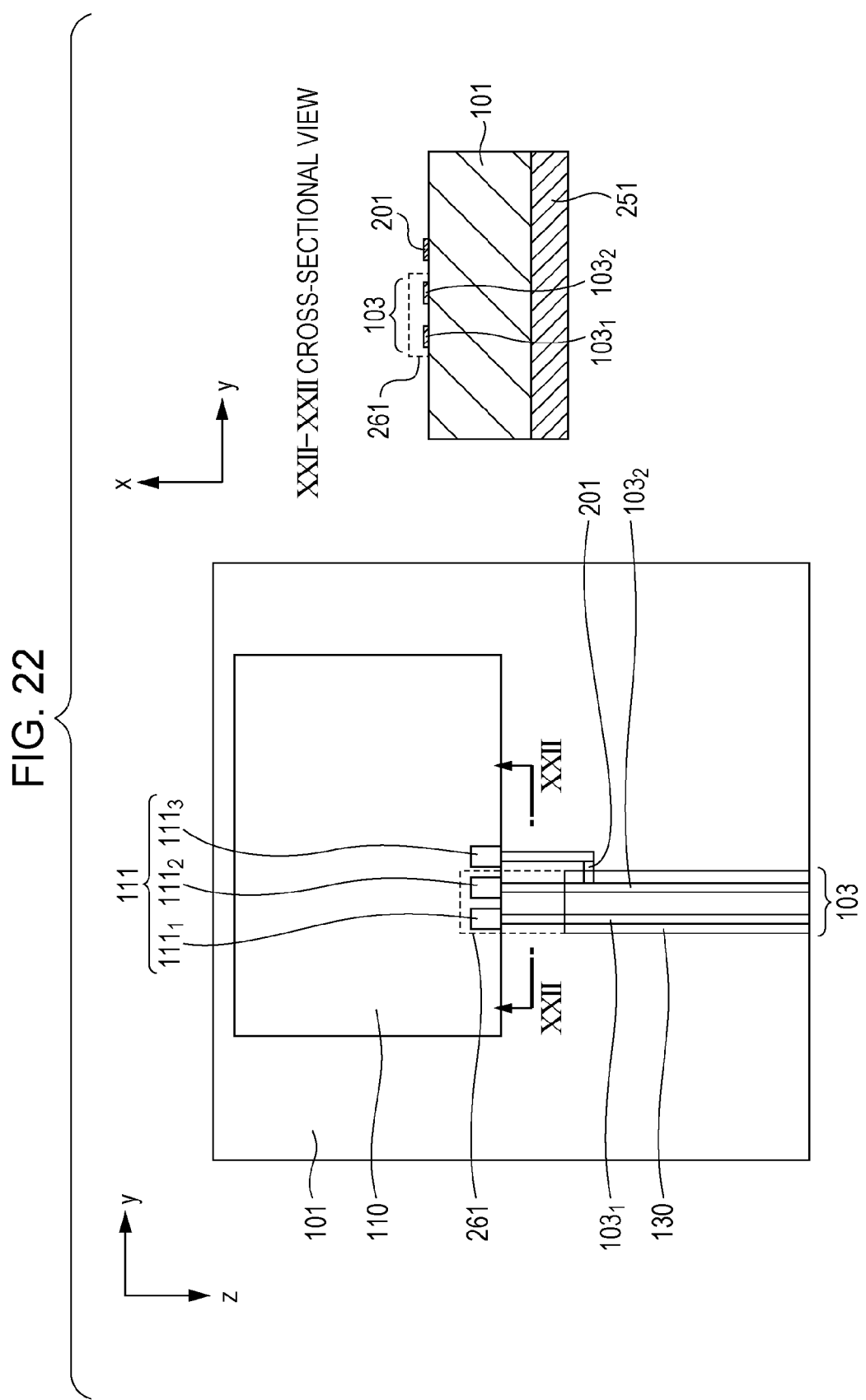
FIG. 22 is an upper view and a cross-sectional view illustrating a configuration example of an eighth embodiment of the electronic circuit to which the embodiments of the present technology are applied.

FIG. 22 is an upper view (plan view) and a cross-sectional view illustrating a configuration example of an eighth embodiment of the electronic circuit to which the embodiments of the present technology are applied.

Here, in the drawing, the same symbols are given to portions corresponding to the fifth embodiment of FIG. 16 and the seventh embodiment of FIG. 20, and description thereof will be omitted below as appropriate.

While in the seventh embodiment of FIG. 20, the thin metallic film as the grounded metal 251 is provided in an area on the reverse face side of the mounting unit 101 excluding at least the area corresponding to the portion where the conductors $103_1$ and $103_2$ configuring the coplanar strip track 103 are connected with the pads $111_1$ and $111_2$ of the single-ended I/F 111, in the eighth embodiment, the thin metallic film as the grounded metal 251 is provided, for example, over the entire area on the reverse face side of the mounting unit 101 including the area corresponding to the portion where the conductors $103_1$ and $103_2$ configuring the coplanar strip 103 are connected with the pads $111_1$ and $111_2$ of the single-ended I/F 111.

However, in the eighth embodiment, a dielectric 261 with a greater permittivity than the dielectric 130 is placed on a portion of an area of the coplanar strip track 103 including the portion where the conductors $103_1$ and $103_2$ configuring the coplanar strip track 103 are connected to the pads $111_1$ and $111_2$ of the single-ended I/F 111.

That is, in the eighth embodiment, the dielectric 261 with a greater permittivity than the dielectric 130 is placed on another area of the coplanar strip track 103 in a portion of the area on the coplanar strip track 103 including the portion where the conductors $103_1$ and $103_2$ are connected to the pads $111_1$ and $111_2$.

Here, for example, a dielectric with a relative permittivity of 10 is able to be adopted as the dielectric 130, and for example, a dielectric (dielectric ceramics or the like) with a relative permittivity of 24 is able to be adopted as the dielectric 261.

By placing the dielectric 261 with a greater permittivity than the dielectric 130 on another area of the coplanar strip track 103 in a portion of the area on the coplanar strip track 103 including the connection portion between the coplanar track 103 and the single-ended I/F 111 as described above, it is possible to suppress common mode noise on the coplanar strip track 103.

Figure 23:
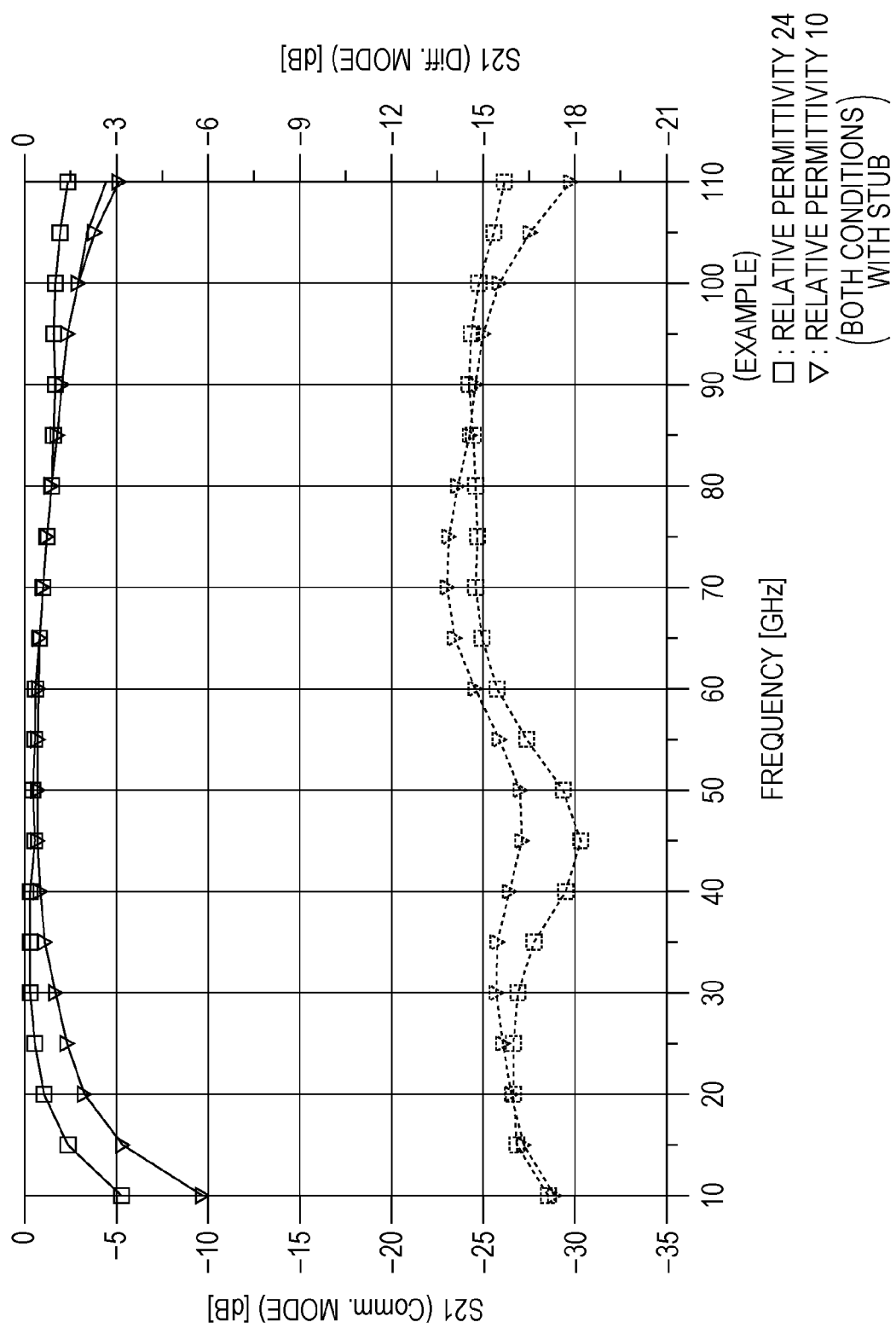
FIG. 23 is a view illustrating the results of a simulation.

That is, FIG. 23 is a view illustrating the results of a simulation performed on the electronic circuit of FIG. 22.

Here, FIG. 23 illustrates the S parameter $S_{21}$ of the electronic circuit of FIG. 22 (hereinafter also referred to as a with-large-dielectric circuit) and the S parameter $S_{21}$ of a circuit in which the same dielectric as the dielectric 130 is placed on the electronic circuit of FIG. 22 instead of the dielectric 261 (hereinafter also referred to as a without-large-dielectric circuit).

Here, in FIG. 23, the solid line represents the S parameter $S_{21}$ of the differential mode of the coplanar strip track 103, and the dotted line represents the S parameter $S_{21}$ of the common mode.

Furthermore, in FIG. 23, triangles represent the S parameter $S_{21}$ of a without-large-dielectric circuit, and squares represent the S parameter $S_{21}$ of a with-large-dielectric circuit.

According to FIG. 23, the S parameter $S_{21}$ of the common mode of the with-large-dielectric circuit (indicated by squares and the dotted line) is less than the case of the without-large-dielectric circuit (indicated by triangles and the dotted line) at a millimeter waveband of approximately 25 GHz to 80 GHz, and it is possible to verify that millimeter waveband common mode noise is able to be suppressed.

Here, the embodiments of the present technology are not limited to the embodiments described above, and various modifications are possible without departing from the gist of the embodiments of the present technology.

That is, while data is transmitted through millimeter waves in the present embodiments, the frequency band used in the transmission of data is not limited to millimeter waves.

Further, while a coplanar strip track is adopted as the differential transmission path transmitting differential signals in the present embodiments, it is possible to adopt a transmission path other than a coplanar strip track as the differential transmission path.

Furthermore, it is possible to perform exchanging of millimeter waves both wirelessly and using wires.

Here, the embodiments of the present technology are able to adopt the following configuration.

[1]

An electronic circuit includes: a semiconductor chip provided with a single-ended I/F including a pad on which single-ended signals are exchanged; and a mounting unit on which a differential transmission path transmitting a differential signal is formed, and on which the semiconductor chip is mounted so that the pad of the single-ended I/F is directly electrically connected to a conductor configuring the differential transmission path.

[2]

The electronic circuit according to [1], wherein the single-ended I/F includes a signal pad on which single-ended signals are exchanged and a grounded pad connected to a ground, the differential transmission path includes two conductors placed to be parallel, and the semiconductor chip is mounted on the mounting unit so that the signal pad is connected to one of the two conductors and the other of the two conductors is connected to the grounded pad.

[3]

The electronic circuit according to [2], wherein a dielectric is placed on the differential transmission path.

[4]

The electronic circuit according to [3], wherein the dielectric has a permittivity that matches the impedance of the single-ended I/F with the impedance of the differential transmission path.

[5]

The electronic circuit according to [3] or [4], wherein the dielectric has a greater permittivity than the permittivity of the mounting unit.

[6]

The electronic circuit according to any one of [3] to [5], wherein the dielectric is placed along the two conductors of the differential transmission path, and has a width to cover the entire area from one of the two conductors to the other conductor.

[7]

The electronic circuit according to any one of [3] to [5], wherein the dielectric is placed along the two conductors of the differential transmission path, and has the same width as the distance between the two conductors without including the two conductors.

[8]

The electronic circuit according to any one of [3] to [5], wherein the dielectric is placed between the two conductors of the differential transmission path along the two conductors, and has the same width as the distance between the two conductors without including the two conductors.

[9]

The electronic circuit according to [2], wherein the thickness of the two conductors of the differential transmission path is adjusted so that the impedance of the single-ended I/F matches the impedance of the differential transmission path.

[10]

The electronic circuit according to [2], wherein the two conductors are formed in a layer form.

[11]

The electronic circuit according to any one of [1] to [10], wherein the differential transmission path is a coplanar strip track.

[12]

The electronic circuit according to any one of [1] to [11], wherein the single-ended signal is a millimeter waveband signal.

[13]

A method of manufacturing an electronic circuit includes: directly electrically connecting, when mounting a semiconductor chip provided with a single-ended I/F including a pad on which single-ended signals are exchanged onto a mounting unit on which a differential transmission path transmitting a differential signal is formed and on which the semiconductor chip is mounted, the pad of the single-ended I/F with a conductor configuring the differential transmission path.

[14]

A mounting member on which a differential transmission path transmitting a differential signal is formed, a dielectric is placed on the differential transmission path, and a semiconductor chip on which a single-ended I/F including a pad on which single-ended signals are exchanged is provided is mounted.

[15]

The mounting member according to [14], wherein the single-ended I/F includes a signal pad on which single-ended signals are exchanged and a grounded pad connected to a ground, the differential transmission path includes two conductors placed to be parallel, and the semiconductor chip is mounted so that the signal pad is connected to one of the two conductors and the other of the two conductors is connected to the grounded pad.

[16]

The mounting member according to [14] or [15], wherein the dielectric has a permittivity that matches the impedance of the single-ended I/F with the impedance of the differential transmission path.

[17]

The mounting member to [14] or [15], wherein the dielectric has a greater permittivity than the permittivity of the mounting unit.

[18]

The mounting member according to any one of [14] to [17], wherein the differential transmission path is a coplanar strip track.

[19]

The mounting member according to any one of [14] to [18], wherein the single-ended signal is a millimeter waveband signal.

The present technology contains subject matter related to that disclosed in Japanese Priority Patent Application JP 2011-241943 filed in the Japan Patent Office on Nov. 4, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic circuit comprising:
    a semiconductor chip with a single-ended I/F including a signal pad via which single-ended signals are exchanged and a grounding pad, the signal pad and grounding pad located on a bottom surface of the semiconductor chip;
    a mounting unit having a top surface with (a) a differential transmission path comprised of a plurality of coplanar strip track conductors formed on the top surface for transmitting a differential signal and (b) a coplanar branch strip track conductor, the semiconductor chip being mounted on the top surface of the mounting unit so that the signal pad of the single-ended I/F is facing the mounting unit and is directly electrically connected to one of the strip track conductors, the signal pad overlying a pad that terminates the one strip track conductor, the direct electrical connection being made via the signal pad and the pad that terminates the one strip track conductor, and
    a thin film grounding layer disposed on a bottom surface of the mounting unit that faces away from the top surface of the mounting unit,
    wherein:
        one end of the branch strip track conductor is electrically connected to the grounding pad, another end of the branch strip track conductor is electrically connected to the one strip track conductor.

2. The electronic circuit according to claim 1, wherein the semiconductor chip includes a second grounding pad electrically connected to the thin film grounding layer, the differential transmission path includes two parallel strip track conductors, and the semiconductor chip is mounted on the mounting unit so that the signal pad is electrically connected to the one of the two strip track conductors and the other of the two strip track conductors is electrically connected to the second grounding pad and to the grounding layer.

3. The electronic circuit according to claim 2, wherein a dielectric is placed on the differential transmission path.

4. The electronic circuit according to claim 3, wherein the dielectric has a permittivity that matches an impedance of the single-ended I/F with the impedance of the differential transmission path.

5. The electronic circuit according to claim 3, wherein the dielectric has a greater permittivity than the permittivity of the mounting unit.

6. The electronic circuit according to claim 3, wherein the dielectric is placed along the two conductors of the differential transmission path, and has a width to cover an entire area from one of the two strip track conductors to the other strip track conductor.

7. The electronic circuit according to claim 3, wherein the dielectric is placed along the two strip track conductors of the differential transmission path, and has the same width as a distance between the two strip track conductors without including the two strip track conductors.

8. The electronic circuit according to claim 3, wherein the dielectric is placed between the two strip track conductors of the differential transmission path along the two strip track conductors, and has the same width as the distance between the two strip track conductors without including the two strip track conductors.

9. The electronic circuit according to claim 2, wherein a thickness of the two strip track conductors of the differential transmission path is adjusted so that the impedance of the single-ended I/F matches the impedance of the differential transmission path.

10. The electronic circuit according to claim 2, wherein the two strip track conductors are formed in a layer form.

11. The electronic circuit according to claim 1, wherein the single-ended signal is a millimeter waveband signal.

12. The electronic circuit of claim 1, wherein:
    the branch strip track has an L-shape in plan view with a first branch portion extending perpendicular to the one strip track conductor, and a second branch portion extending parallel to the one strip track conductor, and
    the second branch portion has a length of $\lambda/4$ of a wavelength $\lambda$ of a millimeter signal of interest so at to be a bandpass filter for such signal.

13. A mounting member comprising:
    a differential transmission path comprised of coplanar strip track conductors formed on a top surface of the mounting member for transmitting a differential signal on the top surface of the mounting unit;
    a coplanar branch strip track conductor having one end electrically connected to one of the strip track conductors;
    a thin film grounding layer on a bottom surface of the mounting unit that faces away from the top surface of the mounting unit; and
    a dielectric on the differential transmission path,
    wherein,
        the mounting unit is configured to accept on the top surface thereof a semiconductor chip with a single-ended I/F including a signal pad via which single-ended signals are exchanged and a grounding pad such that (a) the signal pad is directly electrically connected to the one strip track conductor of the differential transmission path and overlies a pad that terminates the one strip track conductor, the direct electrical connection being made via the signal pad and the pad that terminates the one strip track conductor, (b) another end of the branch strip track conductor is electrically connected to the grounding pad.

14. The mounting member according to claim 13, the differential transmission path includes two parallel strip track conductors such that the signal pad is electrically connected to one of the two strip track conductors and the other of the two strip track conductors is electrically connected to a second grounding pad on the bottom of semiconductor chip.

15. The mounting member according to claim 14, wherein the dielectric has a permittivity that matches the impedance of the single-ended I/F with the impedance of the differential transmission path.

16. The mounting member according to claim 14, wherein the dielectric has a greater permittivity than the permittivity of the mounting unit.

17. The mounting member according to claim 13, wherein the single-ended signal is a millimeter waveband signal.

18. The mounting unit of claim 13, wherein:
the branch strip track has an L-shape in plan view with a first branch portion extending perpendicular to the one strip track conductor, and a second branch portion extending parallel to the one strip track conductor, and
the second branch portion has a length of $\lambda/4$ of a wavelength $\lambda$ of a millimeter signal of interest so at to be a bandpass filter for such signal.

19. An apparatus comprising:
a mounting unit have a major surface on which are located two parallel strip track conductors constituting a differential signal path and a branch strip track conductor, the branch strip track conductor having one end electrically connected to one of the parallel strip track conductors;
a chip having a signal pad via which single ended signals are exchanged and a grounding pad, both of which are located on a bottom side of the chip, the chip mounting on the mounting unit with the bottom side facing the mounting unit and the signal pad electrically connected to the one parallel strip track conductor and the grounding pad electrically connected to another end of the branch strip track conductor; and
a grounding layer on another surface of the mounting unit.

20. The apparatus of claim 19, wherein the chip has a second grounding pad on the bottom side which is electrically connected to the other parallel strip track conductor.

21. The apparatus of claim 19, wherein the single ended signals are millimeter wave signal with wavelengths of 1 to 10 mm.

22. A method of manufacturing an electronic circuit comprising:
(a) providing a semiconductor chip with a single-ended I/F including a signal pad via which single-ended signals are exchanged and first and second grounding pads, the signal pad and the first and second grounding pads located on a bottom surface of the semiconductor chip;
(b) providing a mounting unit having a top surface with (a) a differential transmission path comprised of a plurality of coplanar strip track conductors on the top surface for transmitting a differential signal and (b) a coplanar branch strip track conductor one end of which is electrically connected to one strip track conductor; and
(c) providing a thin film grounding layer on a bottom surface of the mounting unit that faces away from the top surface of the mounting unit; and
(d) mounting the semiconductor chip on the mounting unit such that (1) the signal pad of the single-ended I/F is facing the mounting unit, is directly electrically connected to the one strip track conductor, and overlies a pad that terminates the one strip track conductor, the direct electrical connection being made via the signal pad and the pad that terminates the one strip track conductor, (2) the first grounding pad is electrically connected to another strip track conductor, and (3) another end of the branch strip conductor is electrically connected to the second grounding pad.

23. The method of claim 22, wherein:
the branch strip track has an L-shape in plan view with a first branch portion extending perpendicular to the one strip track conductor, and a second branch portion extending parallel to the one strip track conductor, and
the second branch portion has a length of $\lambda/4$ of a wavelength $\lambda$ of a millimeter signal of interest so at to be a bandpass filter for such signal.

* * * * *